(12) United States Patent
Ono et al.

(10) Patent No.: US 10,587,092 B2
(45) Date of Patent: Mar. 10, 2020

(54) SEMICONDUCTOR LASER, ELECTRONIC APPARATUS, AND METHOD OF DRIVING SEMICONDUCTOR LASER

(71) Applicant: SONY CORPORATION, Tokyo (JP)

(72) Inventors: Tomoki Ono, Kanagawa (JP); Mikio Takiguchi, Kanagawa (JP); Toyoharu Oohata, Tokyo (JP); Takahiro Koyama, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/323,027

(22) PCT Filed: Jun. 22, 2017

(86) PCT No.: PCT/JP2017/023040
§ 371 (c)(1),
(2) Date: Feb. 4, 2019

(87) PCT Pub. No.: WO2018/037697
PCT Pub. Date: Mar. 1, 2018

(65) Prior Publication Data
US 2019/0181608 A1    Jun. 13, 2019

(30) Foreign Application Priority Data
Aug. 23, 2016 (JP) .................................. 2016-162773

(51) Int. Cl.
*H01S 5/022* (2006.01)
*H01S 5/22* (2006.01)
(Continued)

(52) U.S. Cl.
CPC ............ *H01S 5/022* (2013.01); *H01S 5/0261* (2013.01); *H01S 5/0265* (2013.01);
(Continued)

(58) Field of Classification Search
CPC ...... H01S 5/022; H01S 5/0261; H01S 5/0265; H01S 5/0428; H01S 5/0615; H01S 5/22;
(Continued)

(56) References Cited

U.S. PATENT DOCUMENTS

| | | |
|---|---|---|
| 5,023,878 A | 6/1991 | Berthold et al. |
| 6,215,805 B1 | 4/2001 | Sartorius et al. |

(Continued)

FOREIGN PATENT DOCUMENTS

| | | |
|---|---|---|
| CN | 101950922 A | 1/2011 |
| CN | 102890943 A | 1/2013 |

(Continued)

OTHER PUBLICATIONS

International Search Report and Written Opinion of PCT Application No. PCT/JP2017/023040, dated Aug. 15, 2017, 09 pages of ISRWO.

*Primary Examiner* — Armando Rodriguez
(74) *Attorney, Agent, or Firm* — Chip Law Group

(57) ABSTRACT

In a semiconductor laser according to an embodiment of the present disclosure, a ridge part has a structure in which a plurality of gain regions and a plurality of Q-switch regions are each disposed alternately with each of separation regions being interposed therebetween in an extending direction of the ridge part. The separation regions each have a separation groove that separates from each other, by a space, the gain region and the Q-switch region adjacent to each other. The separation groove has a bottom surface at a position, in a second semiconductor layer, higher than a part corresponding to a foot of each of both sides of the ridge part. The semiconductor laser includes an electrode provided over the bottom surface of each separation groove with an insulating layer being interposed therebetween.

12 Claims, 28 Drawing Sheets

(51) Int. Cl.

| | | |
|---|---|---|
| *H01S 5/026* | (2006.01) | |
| *H01S 5/06* | (2006.01) | |
| *H01S 5/40* | (2006.01) | |
| *H01S 5/042* | (2006.01) | |
| *H01S 5/10* | (2006.01) | |
| *H01S 5/343* | (2006.01) | |
| *H01S 5/20* | (2006.01) | |
| *H01S 5/02* | (2006.01) | |

(52) U.S. Cl.
CPC .......... *H01S 5/0428* (2013.01); *H01S 5/0615* (2013.01); *H01S 5/22* (2013.01); *H01S 5/4006* (2013.01); *H01S 5/0202* (2013.01); *H01S 5/04256* (2019.08); *H01S 5/1017* (2013.01); *H01S 5/209* (2013.01); *H01S 5/2072* (2013.01); *H01S 5/34313* (2013.01); *H01S 2304/04* (2013.01)

(58) Field of Classification Search
CPC .. H01S 5/4006; H01S 5/04256; H01S 5/0202; H01S 5/1017; H01S 5/2072; H01S 5/209; H01S 5/34313; H01S 2304/04
See application file for complete search history.

(56) References Cited

U.S. PATENT DOCUMENTS

| | | |
|---|---|---|
| 6,356,693 B1 | 3/2002 | Shimizu et al. |
| 2004/0091009 A1 | 5/2004 | Matsuda et al. |
| 2011/0007765 A1* | 1/2011 | Kuramoto ............ B82Y 20/00 372/45.01 |
| 2013/0021425 A1 | 1/2013 | Fujita et al. |

FOREIGN PATENT DOCUMENTS

| | | |
|---|---|---|
| EP | 0417989 A2 | 3/1991 |
| EP | 0890204 B1 | 12/1999 |
| EP | 1056169 A2 | 11/2000 |
| JP | 01-262683 A | 10/1989 |
| JP | 03-106094 A | 5/1991 |
| JP | 05-090700 A | 4/1993 |
| JP | 10-229252 A | 8/1998 |
| JP | 2000-507744 A | 6/2000 |
| JP | 2000-338453 A | 12/2000 |
| JP | 2004-214603 A | 7/2004 |
| JP | 2005-039099 A | 2/2005 |
| JP | 2008-258274 A | 10/2008 |
| JP | 2011-018784 A | 1/2011 |
| JP | 2013-026351 A | 2/2013 |
| WO | 97/37406 A1 | 10/1997 |

* cited by examiner

[ FIG. 1 ]
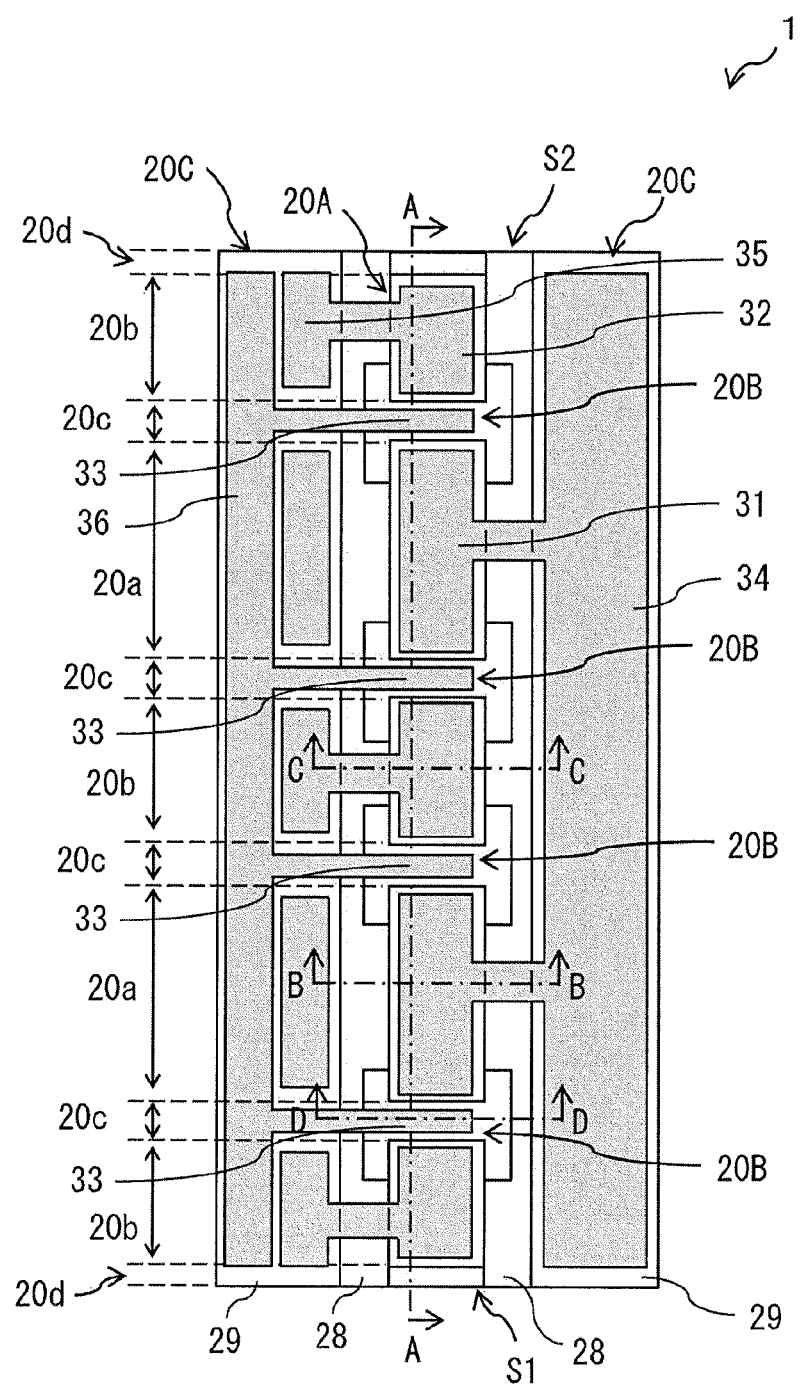

[ FIG. 2 ]
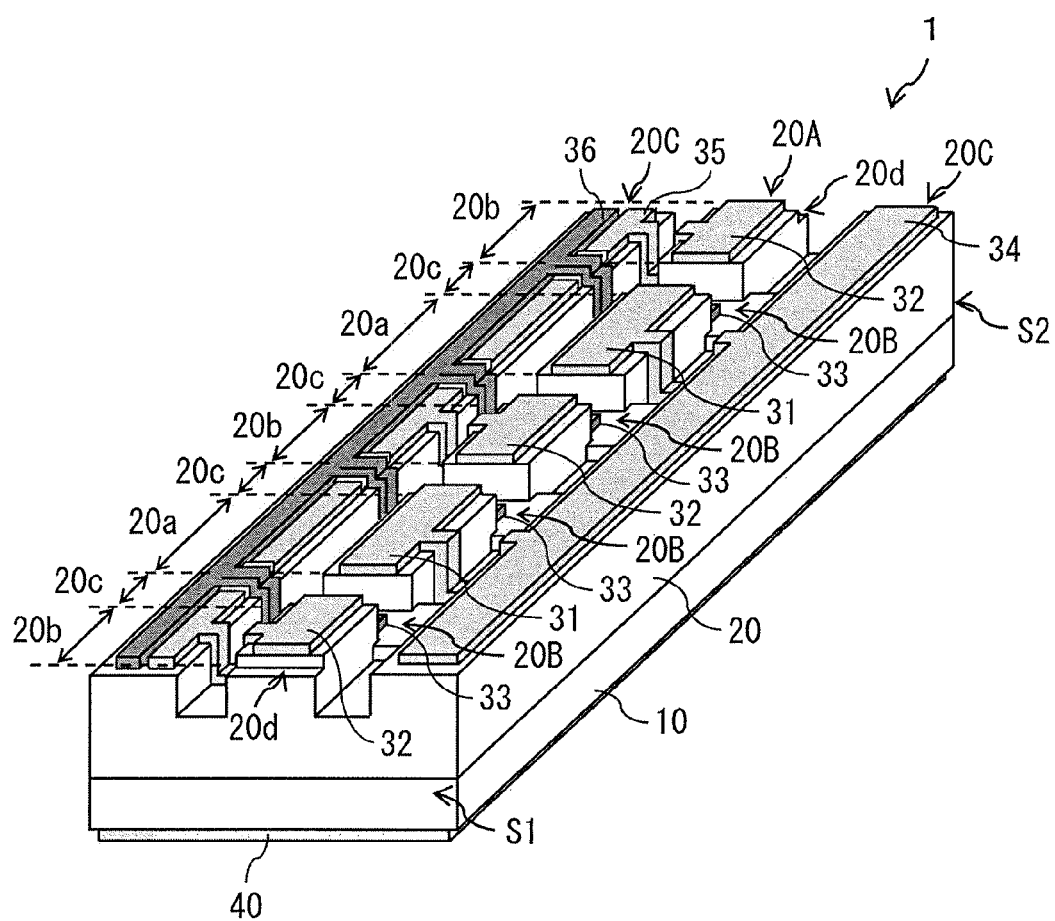

[FIG. 3]
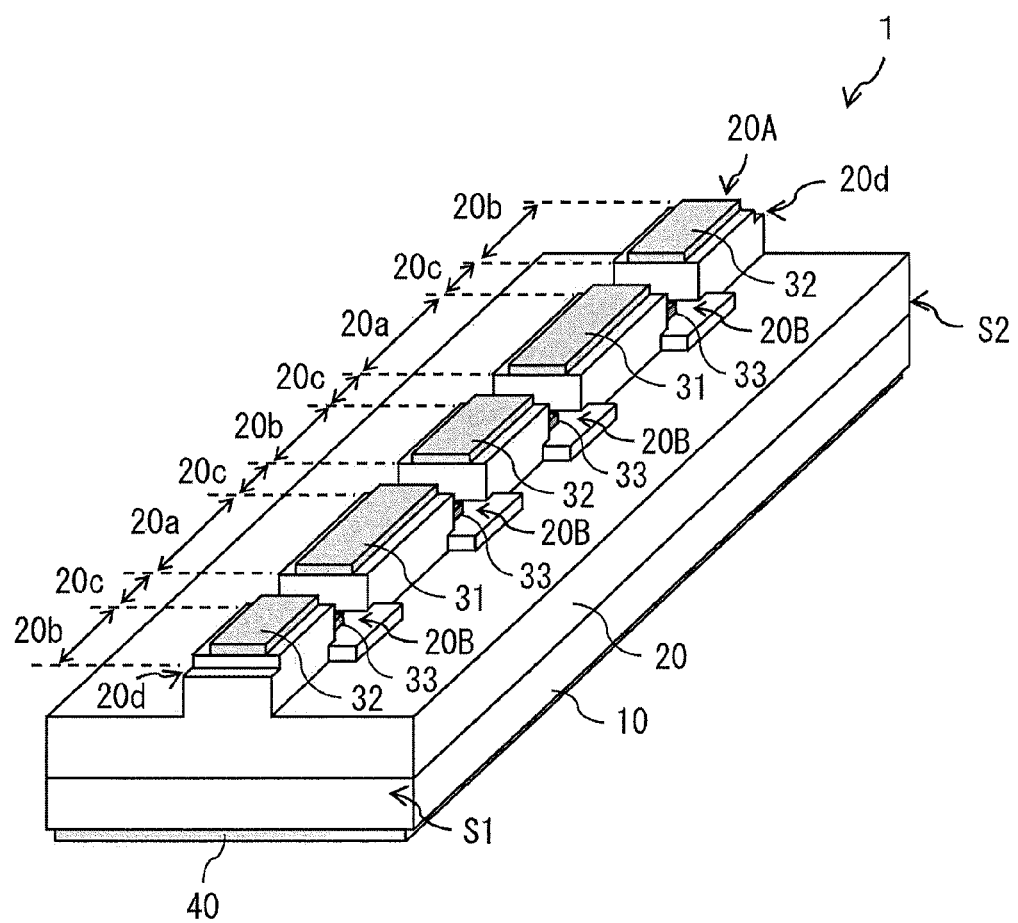

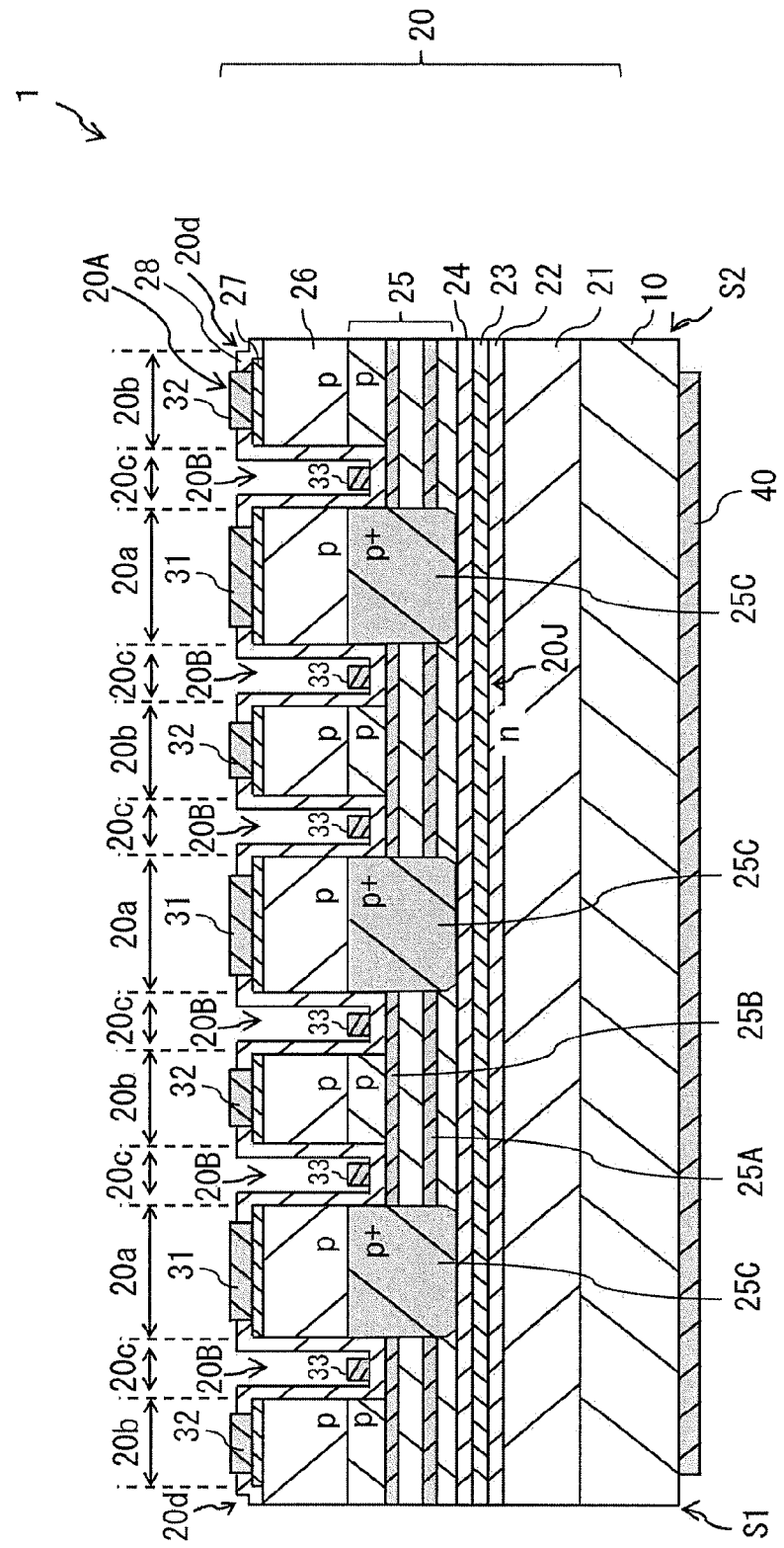
[FIG. 4]

[FIG. 5]
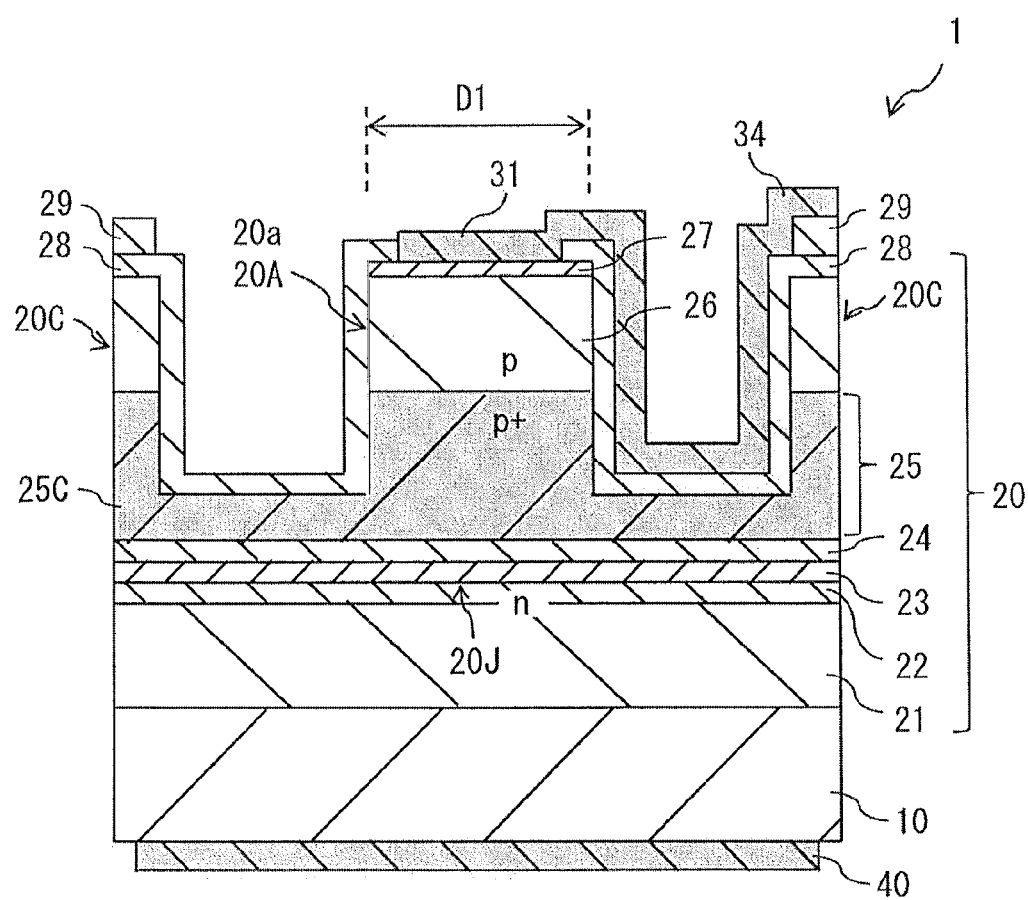

[ FIG. 6 ]
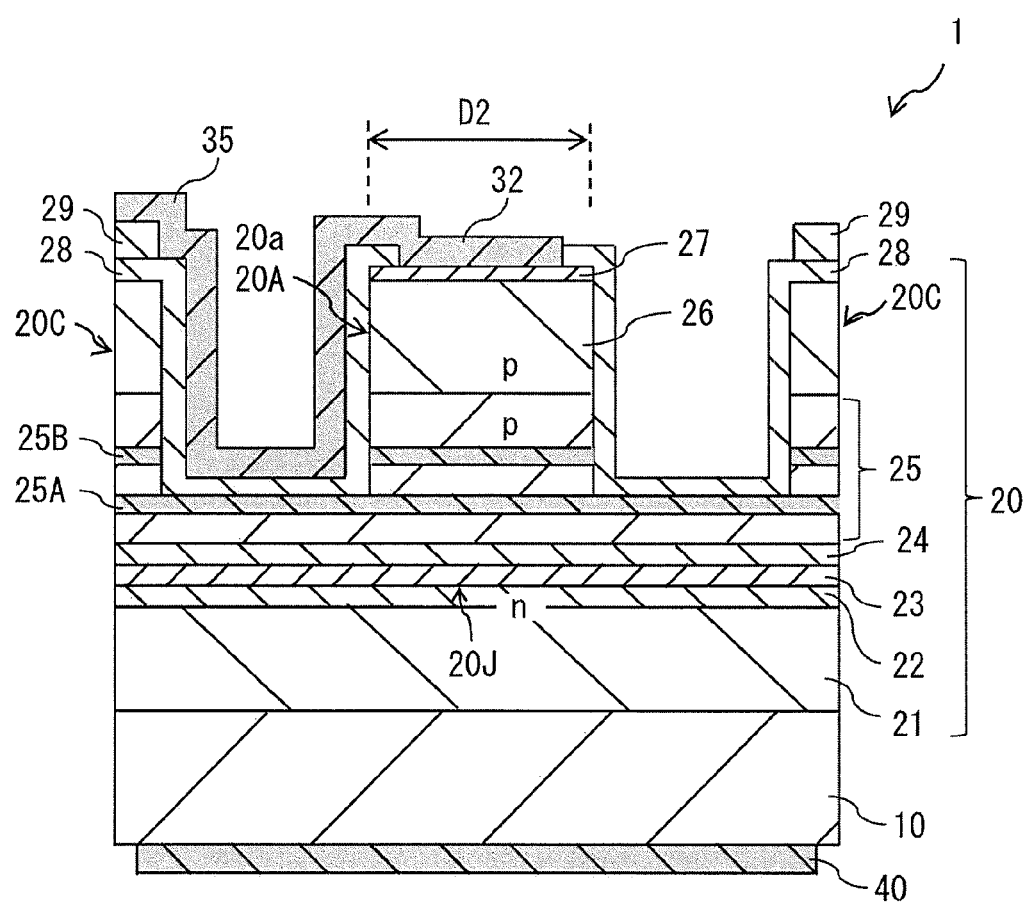

[ FIG. 7 ]
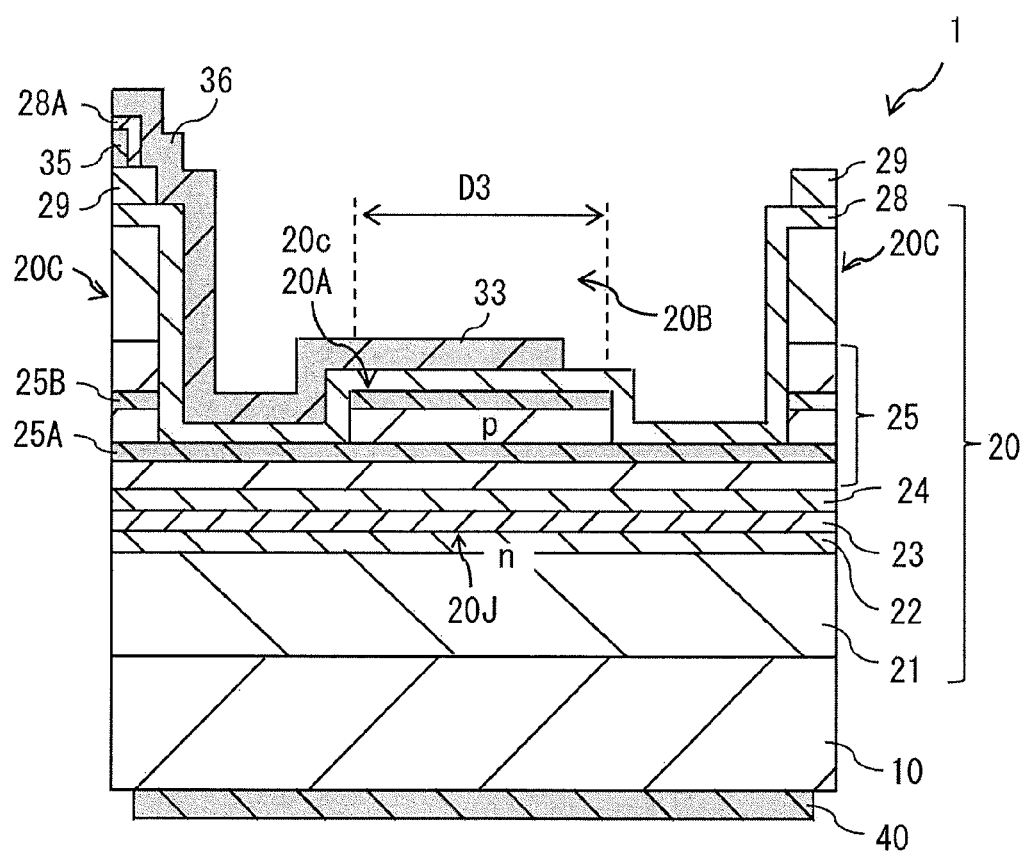

[FIG. 8]
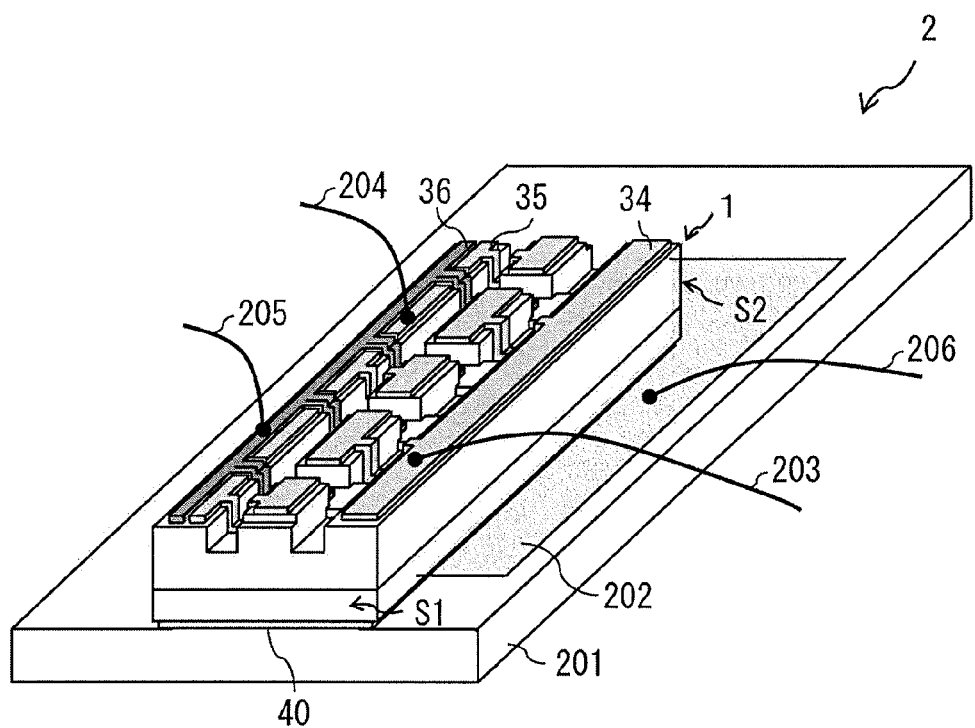

[FIG. 9]
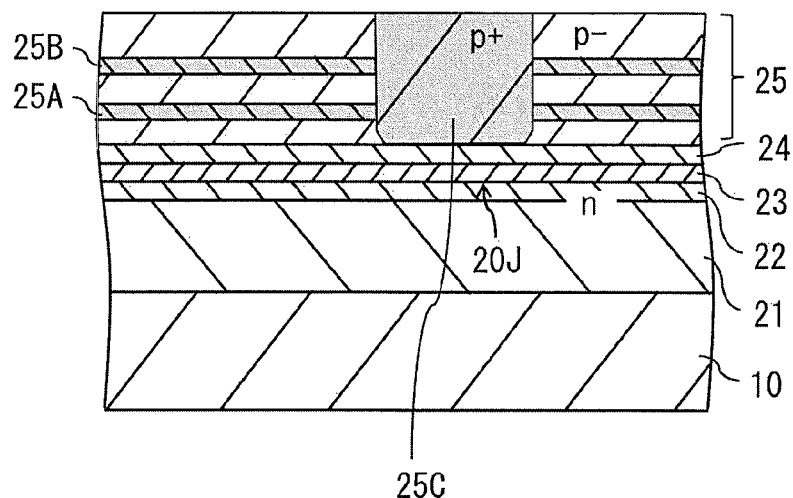
[FIG. 10]
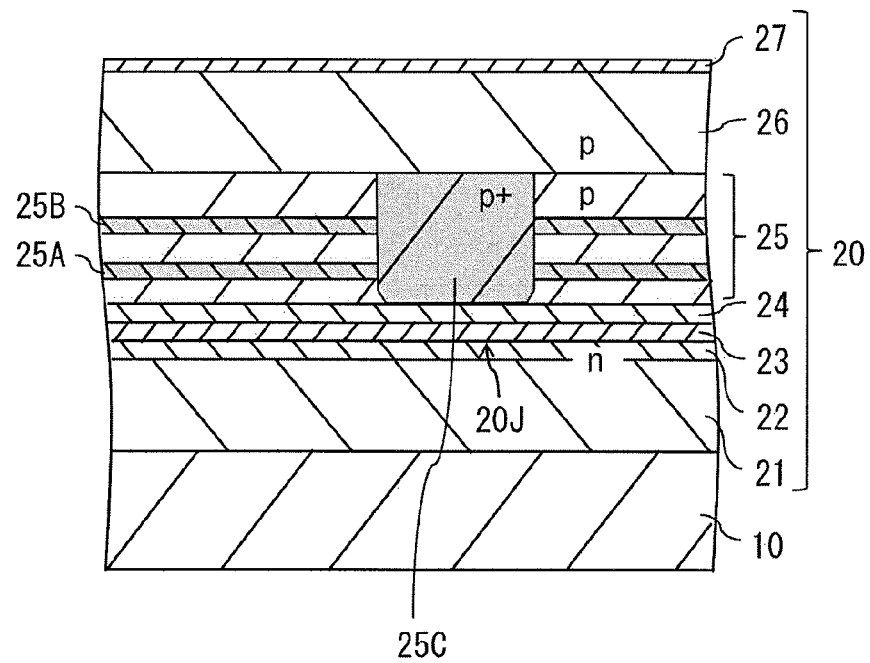

[FIG. 11]
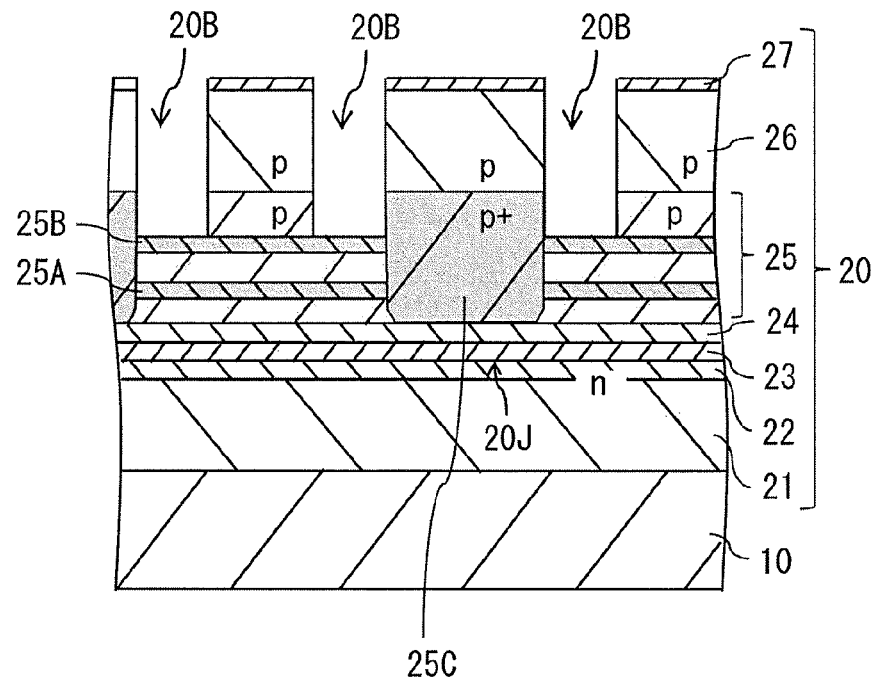
[FIG. 12A]
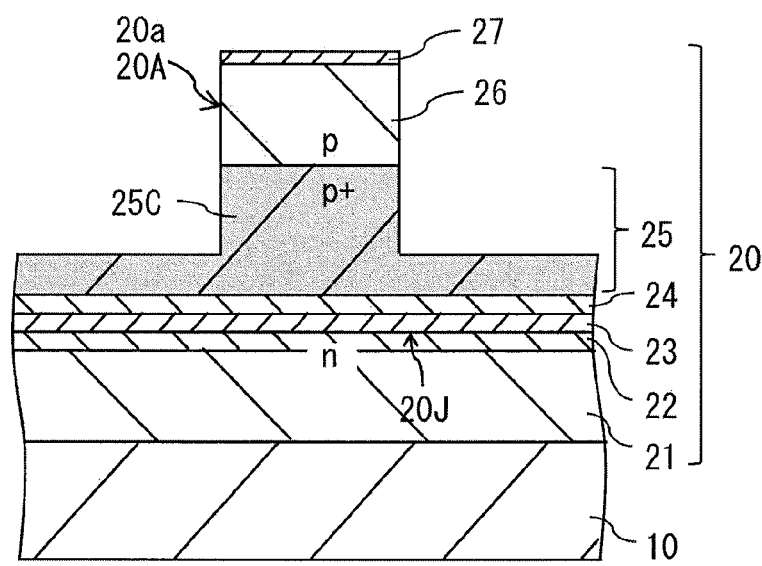

[FIG. 12B]
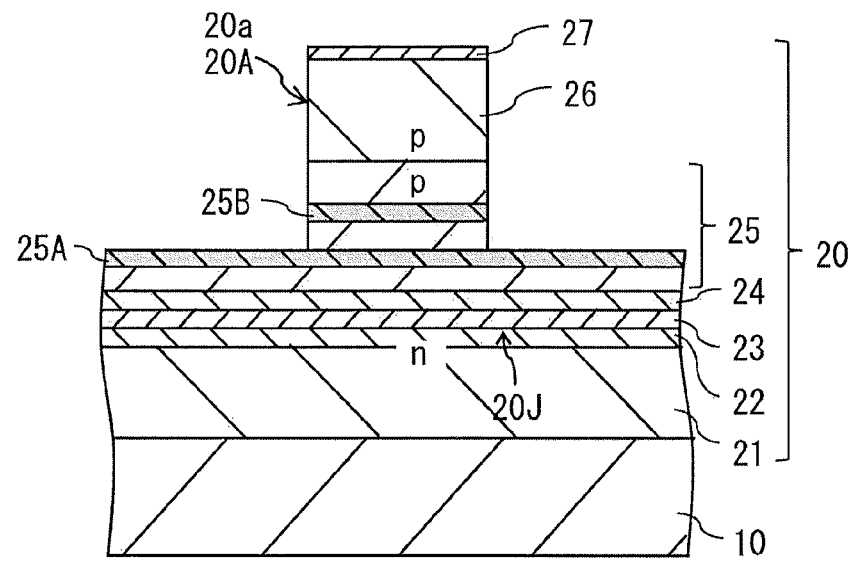
[FIG. 12C]
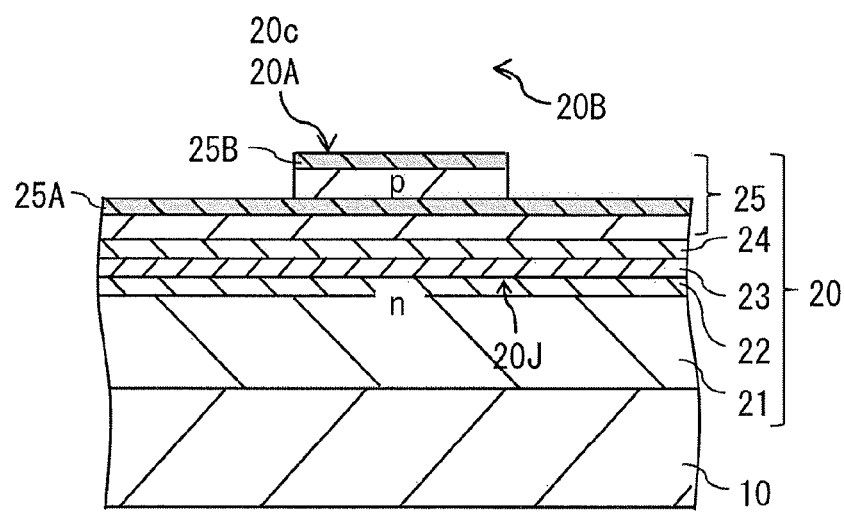

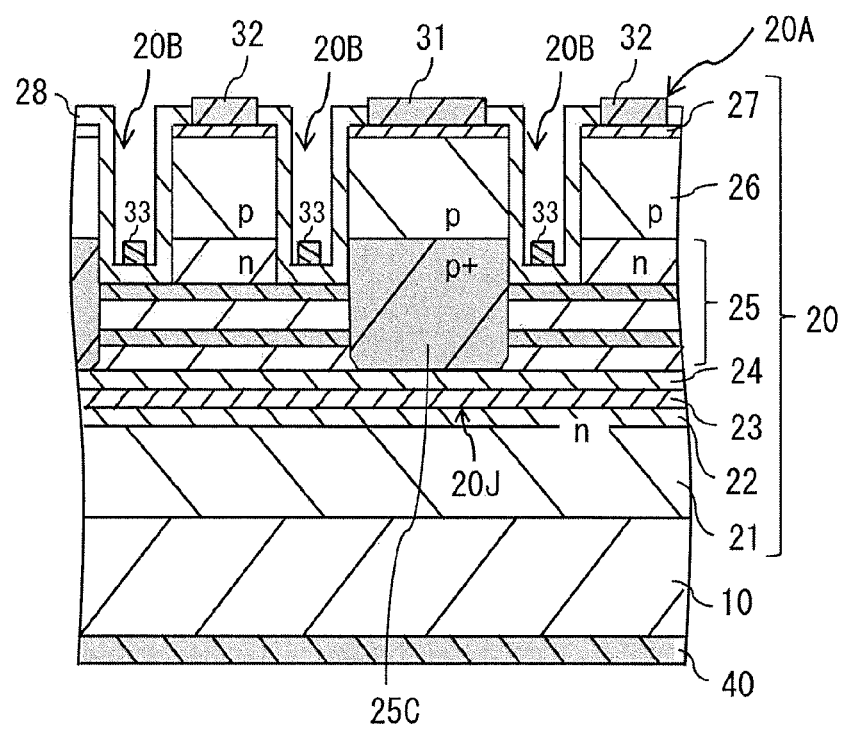
[FIG. 13]

[ FIG. 14A ]
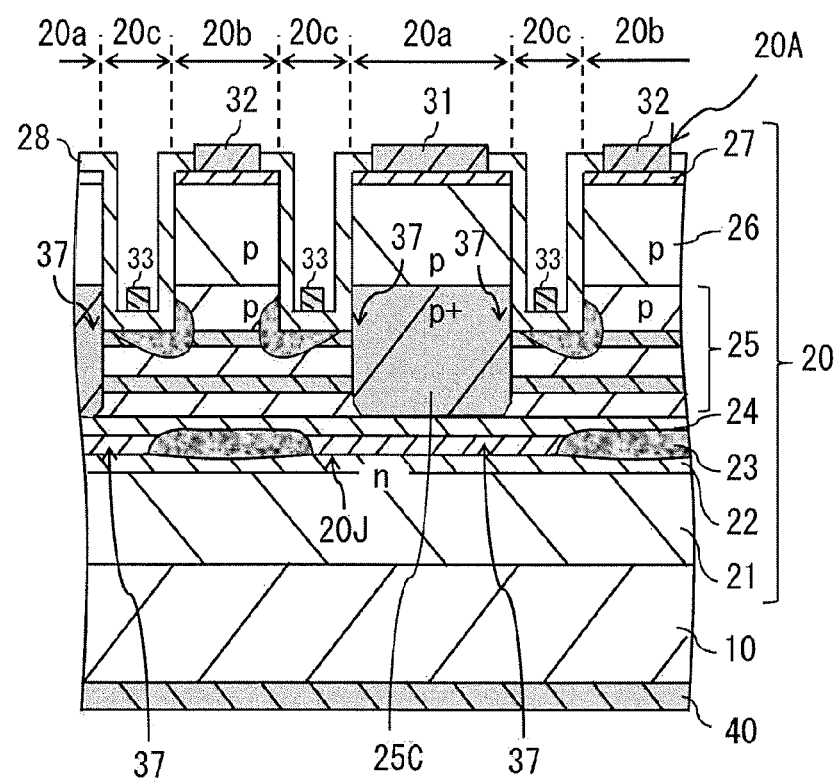

[ FIG. 14B ]
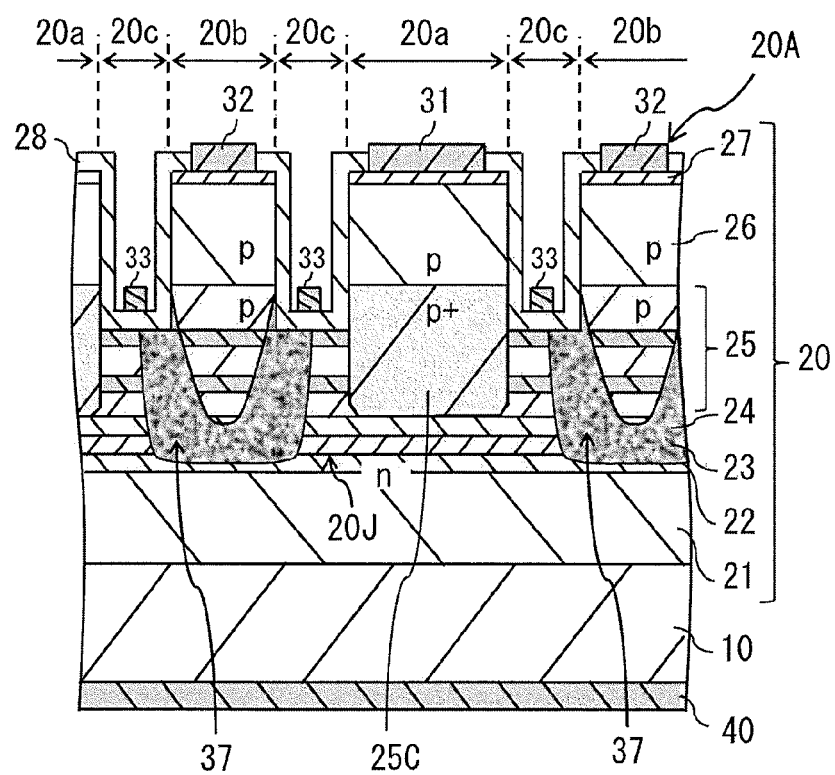

[ FIG. 15 ]
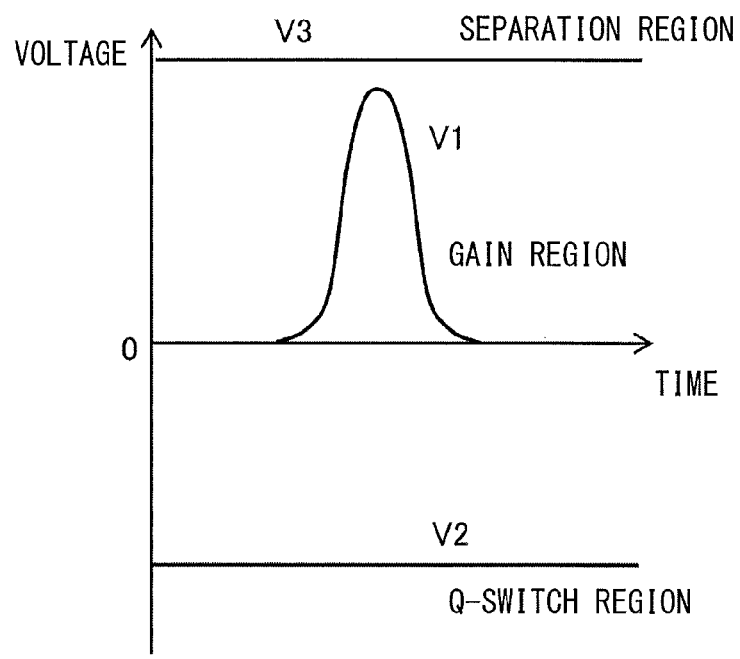
[ FIG. 16 ]
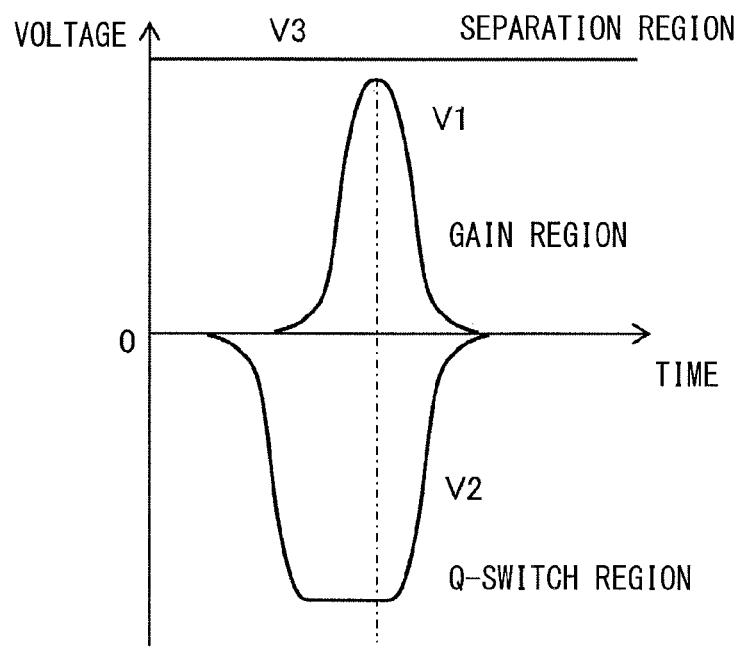

[ FIG. 17 ]
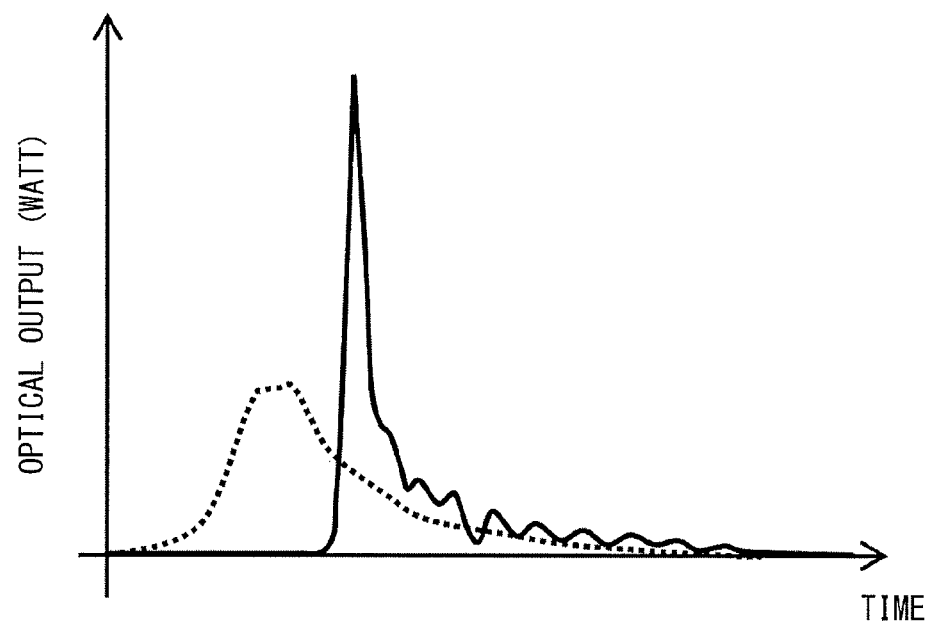
[ FIG. 18 ]
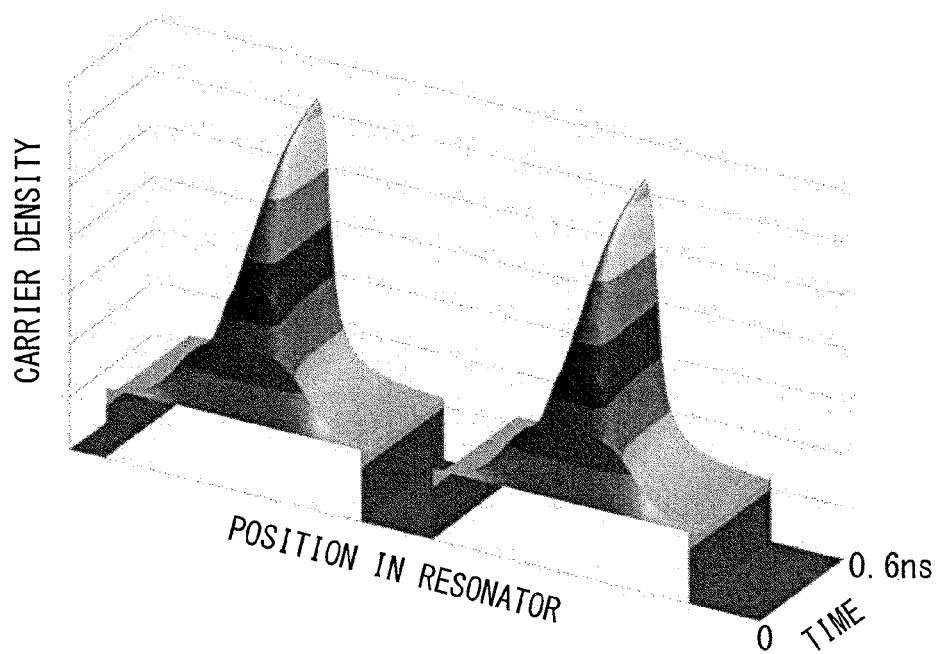

[ FIG. 19 ]
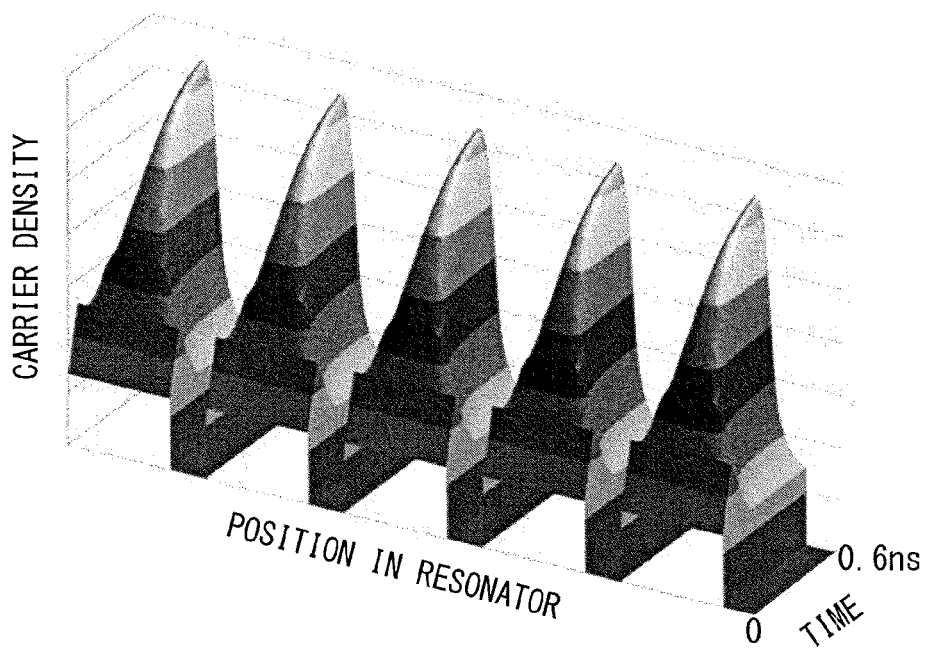
[ FIG. 20 ]
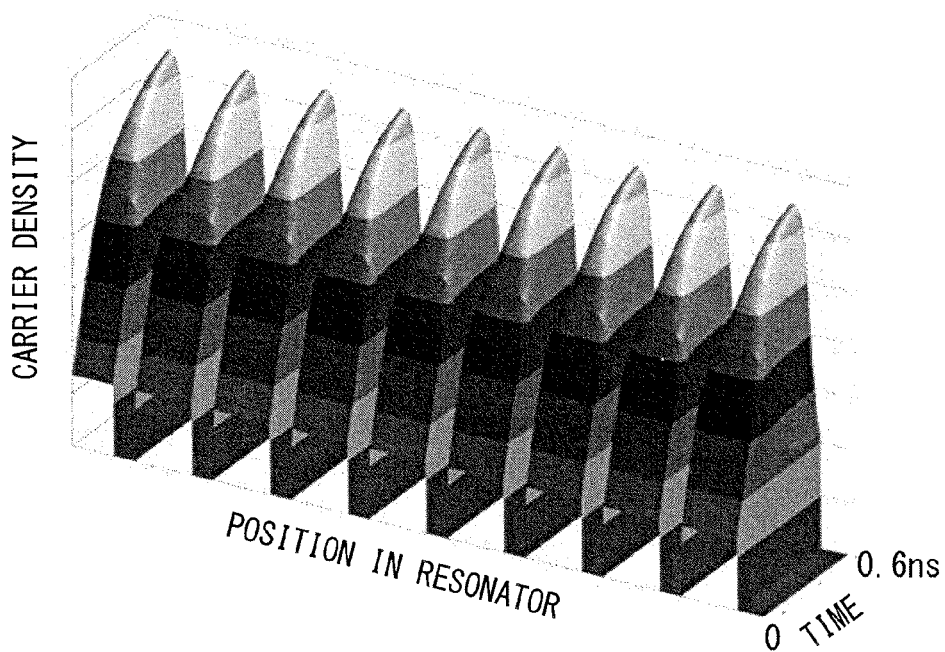

[ FIG. 21 ]
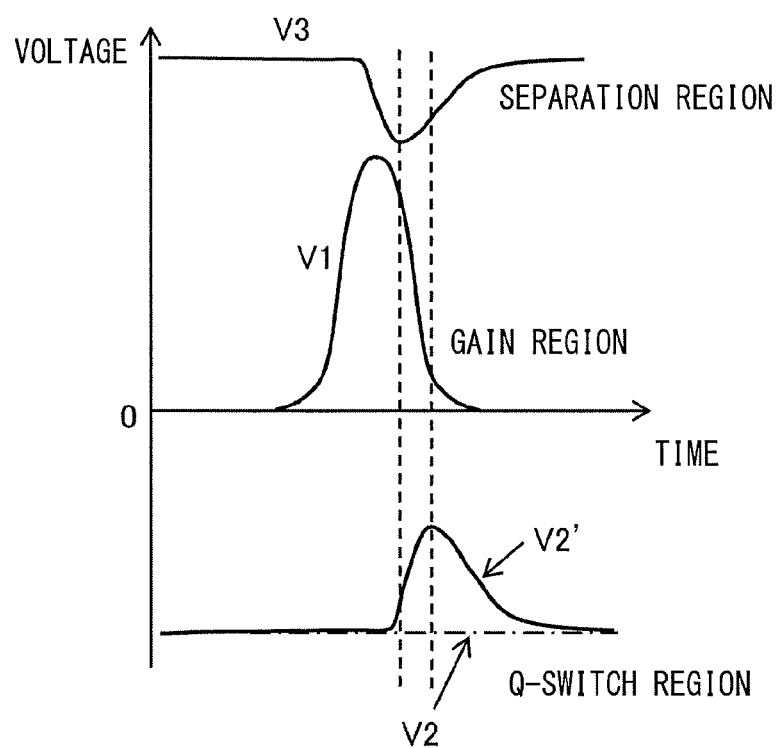

[ FIG. 22 ]
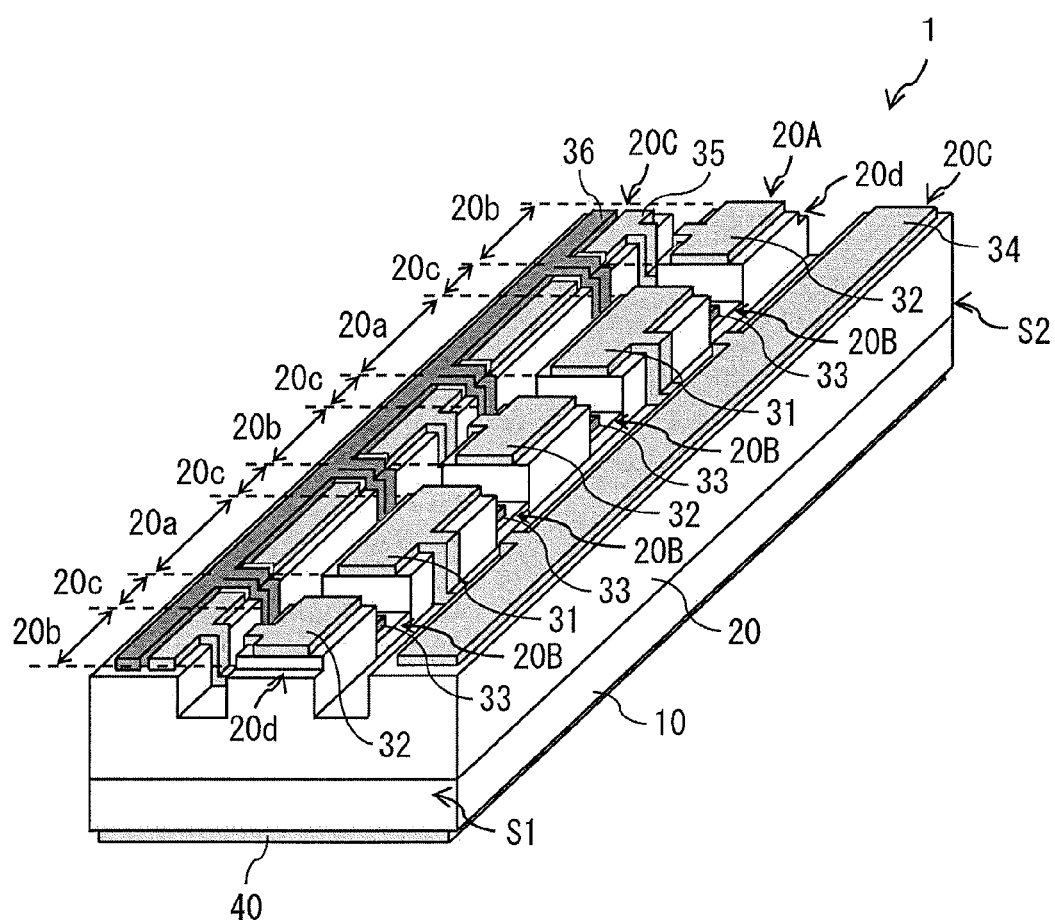

[ FIG. 23 ]
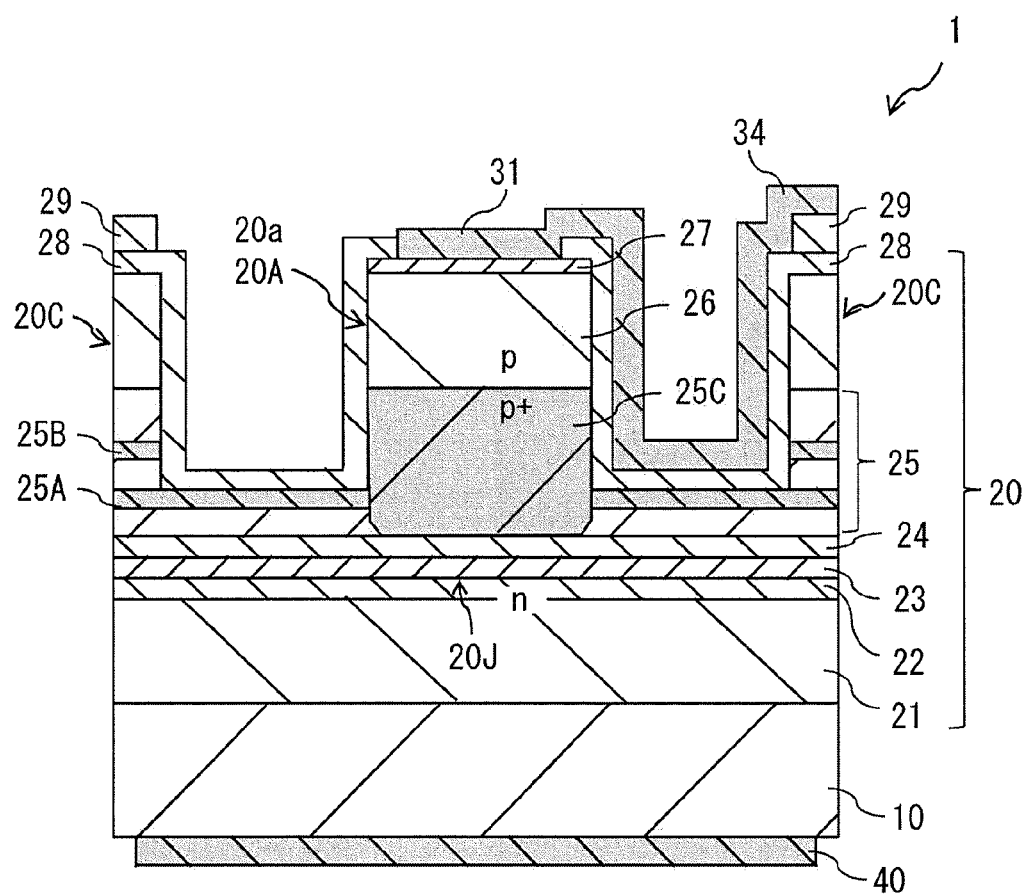

[FIG. 24]
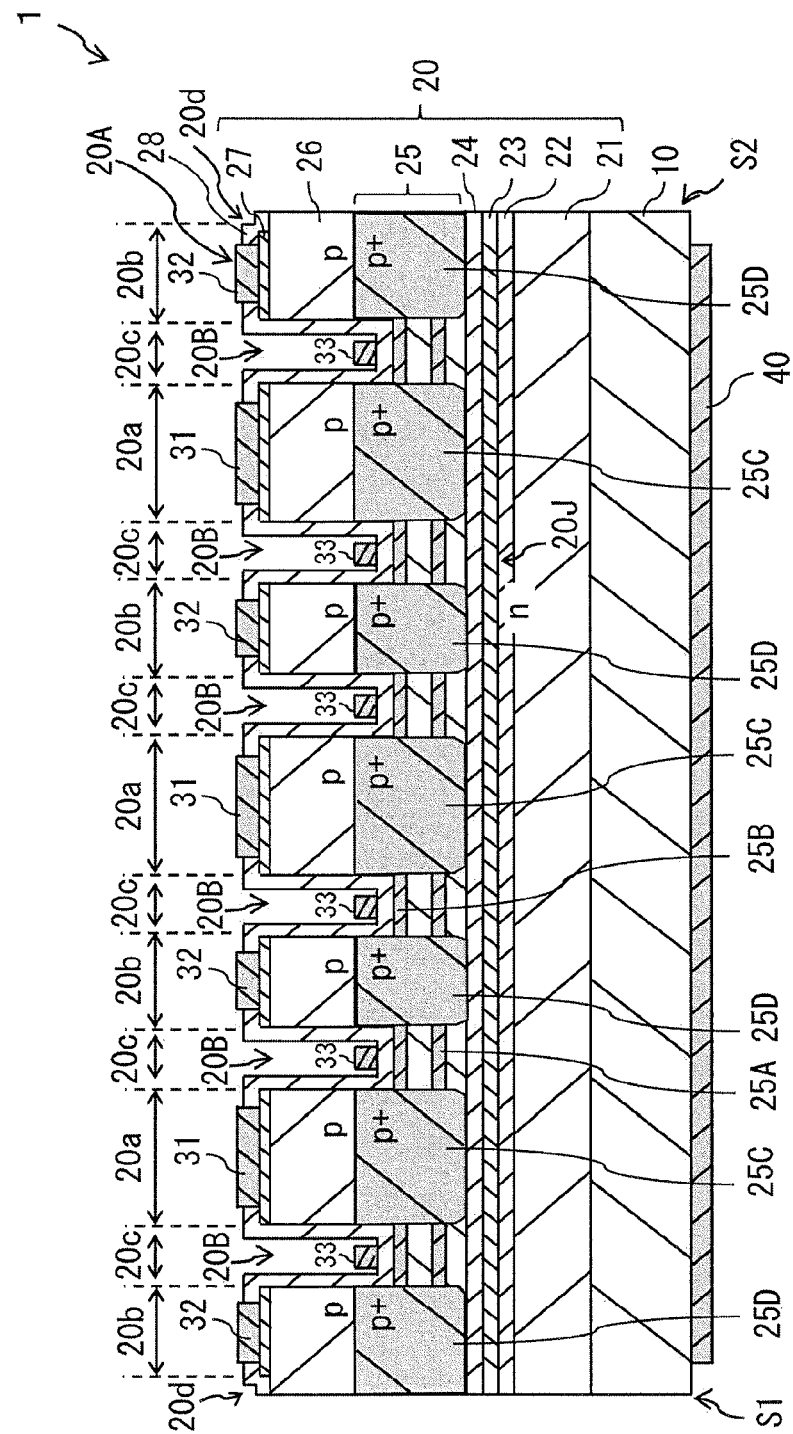

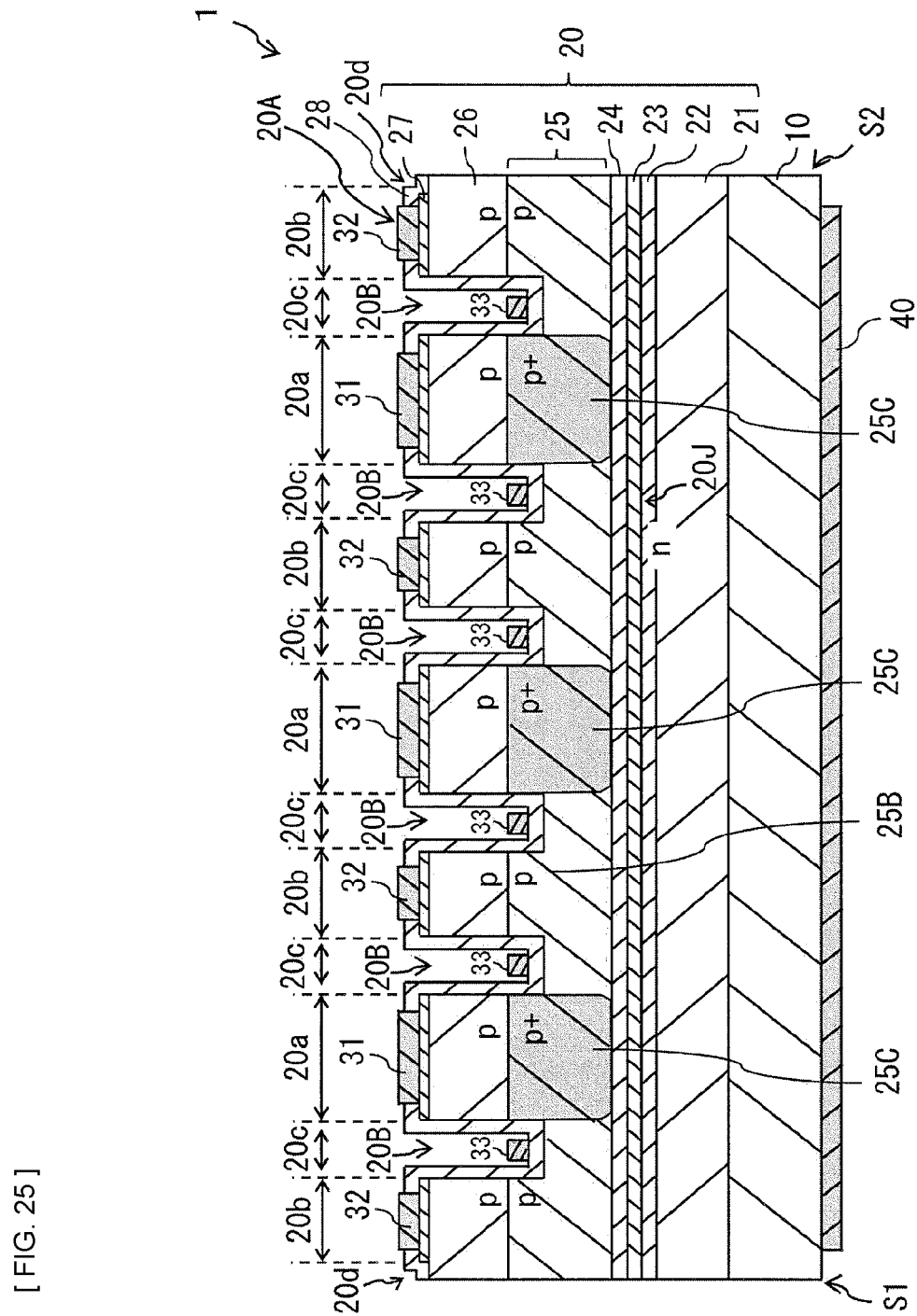
[FIG. 25]

[ FIG. 26 ]
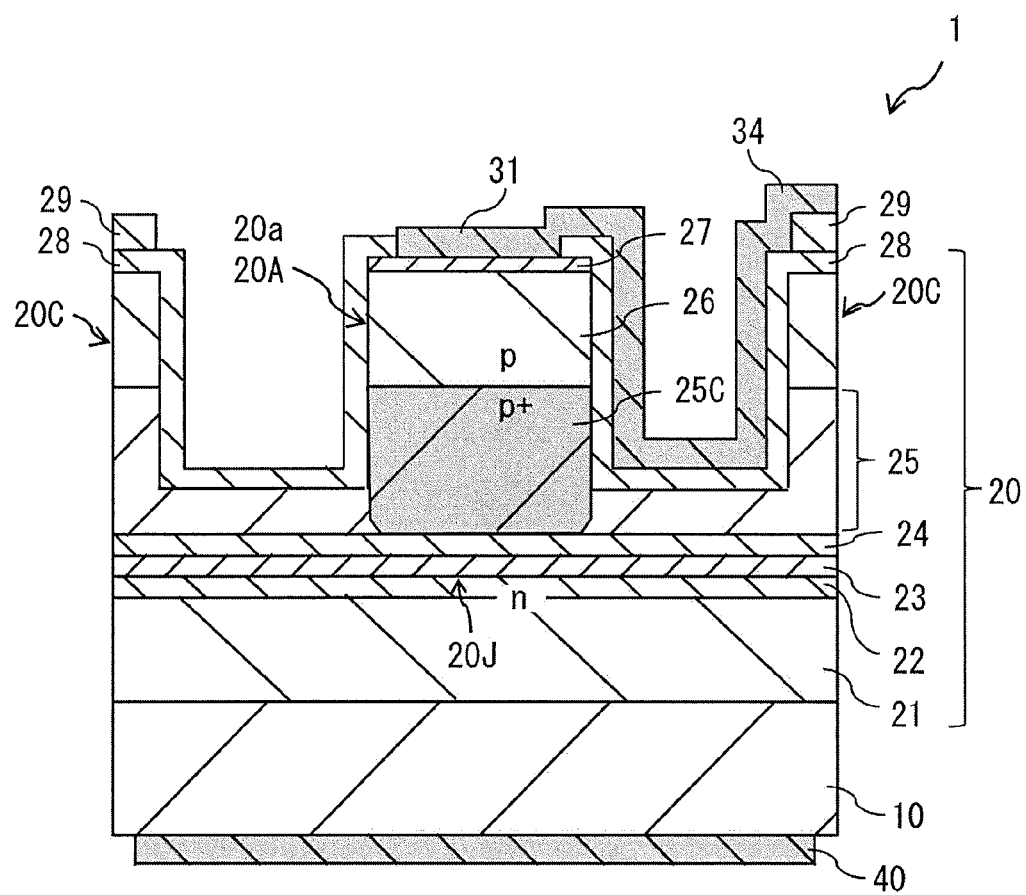

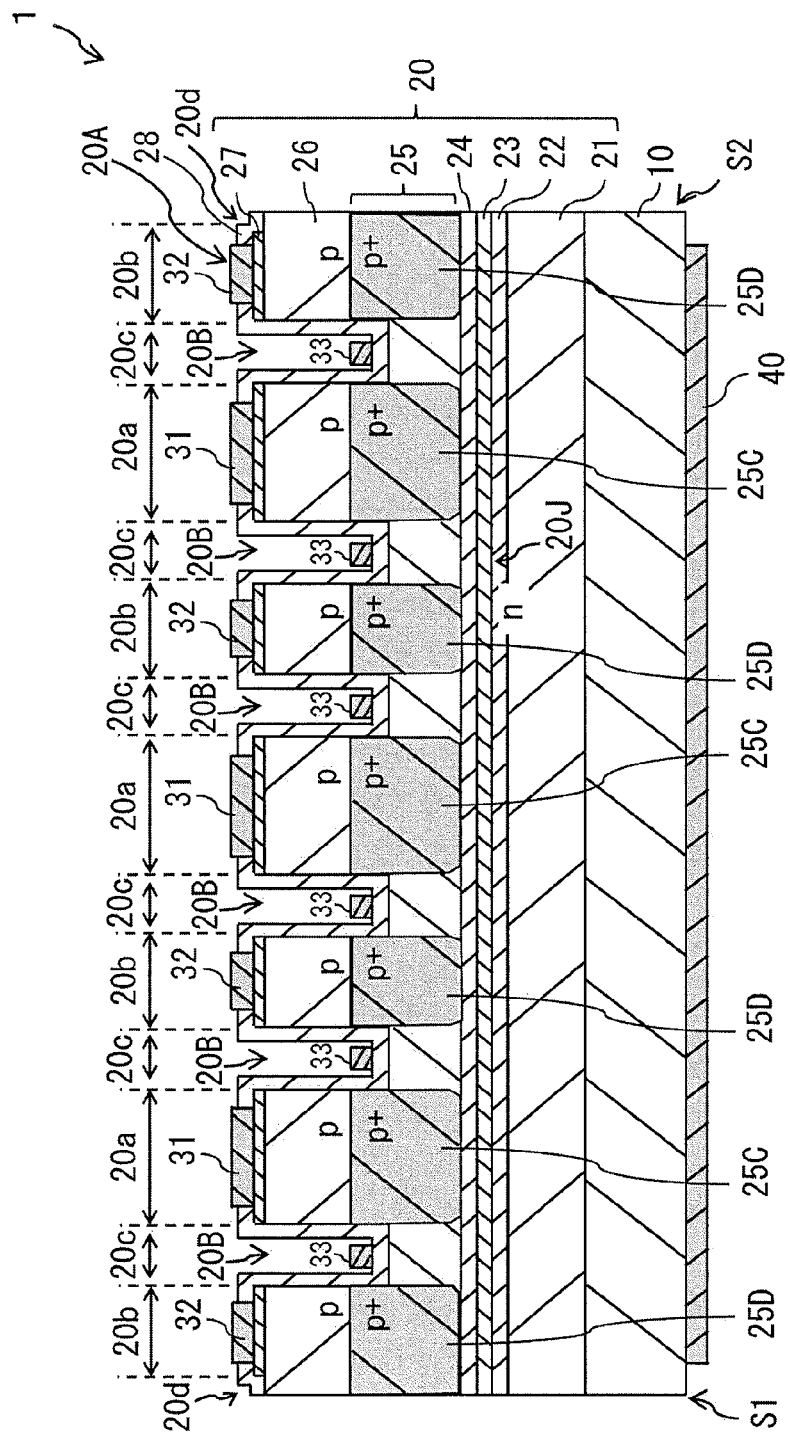
[FIG. 27]

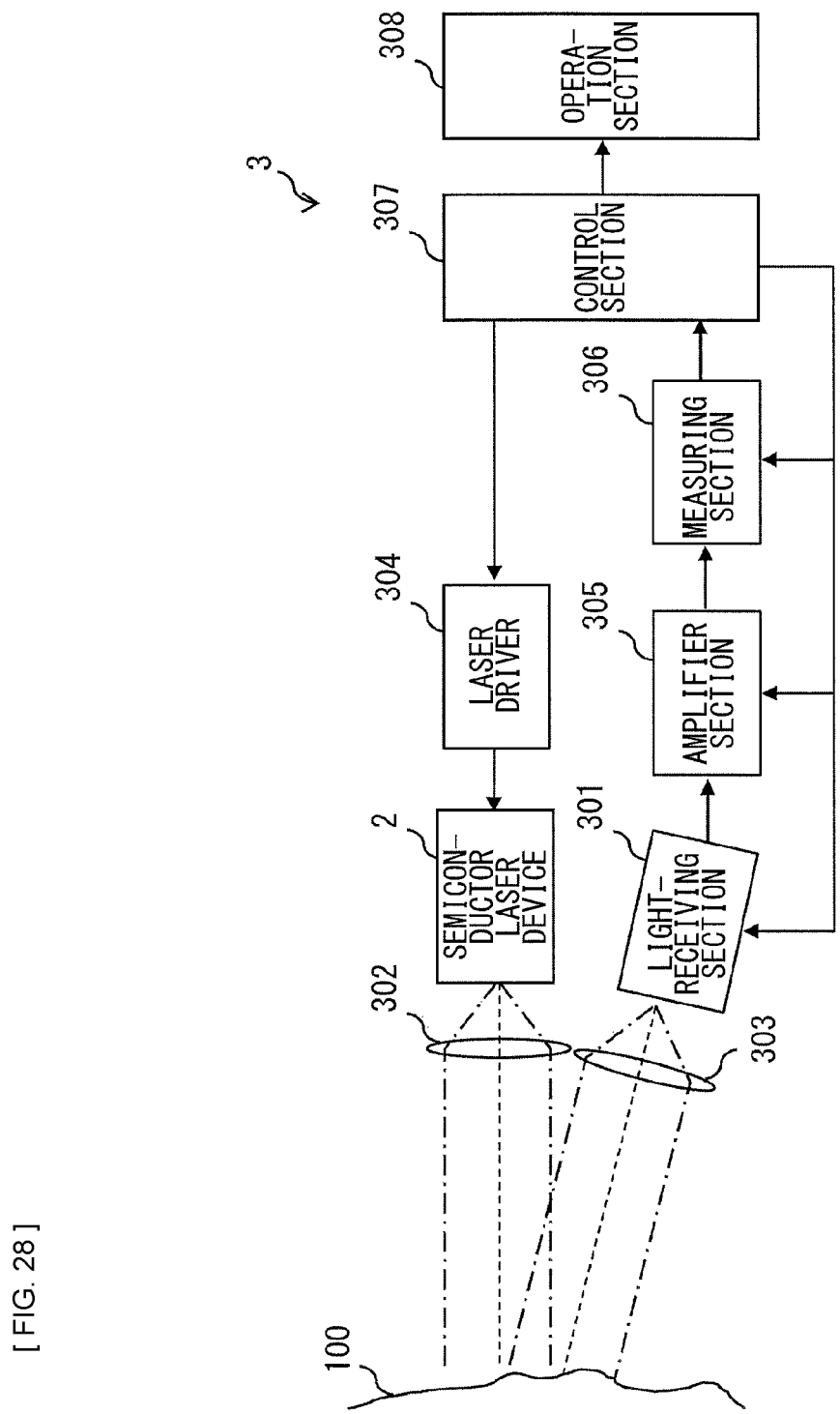
[FIG. 28]

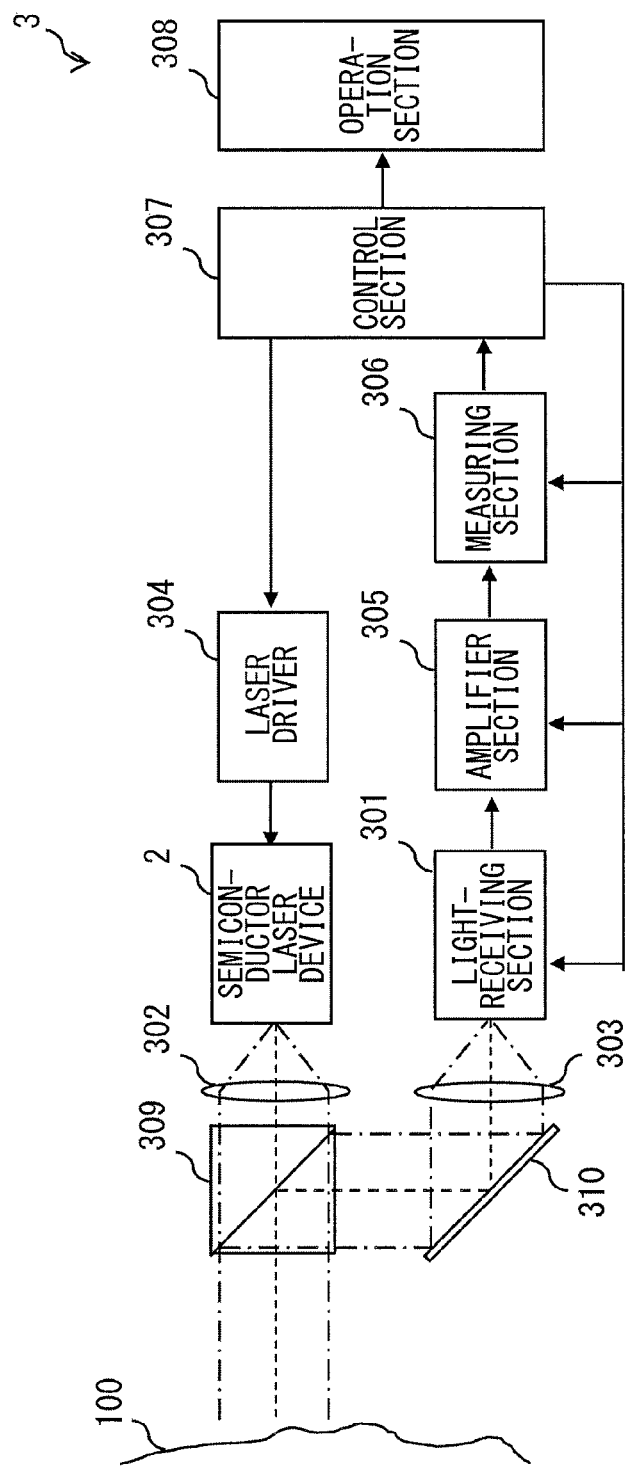
[FIG. 29]

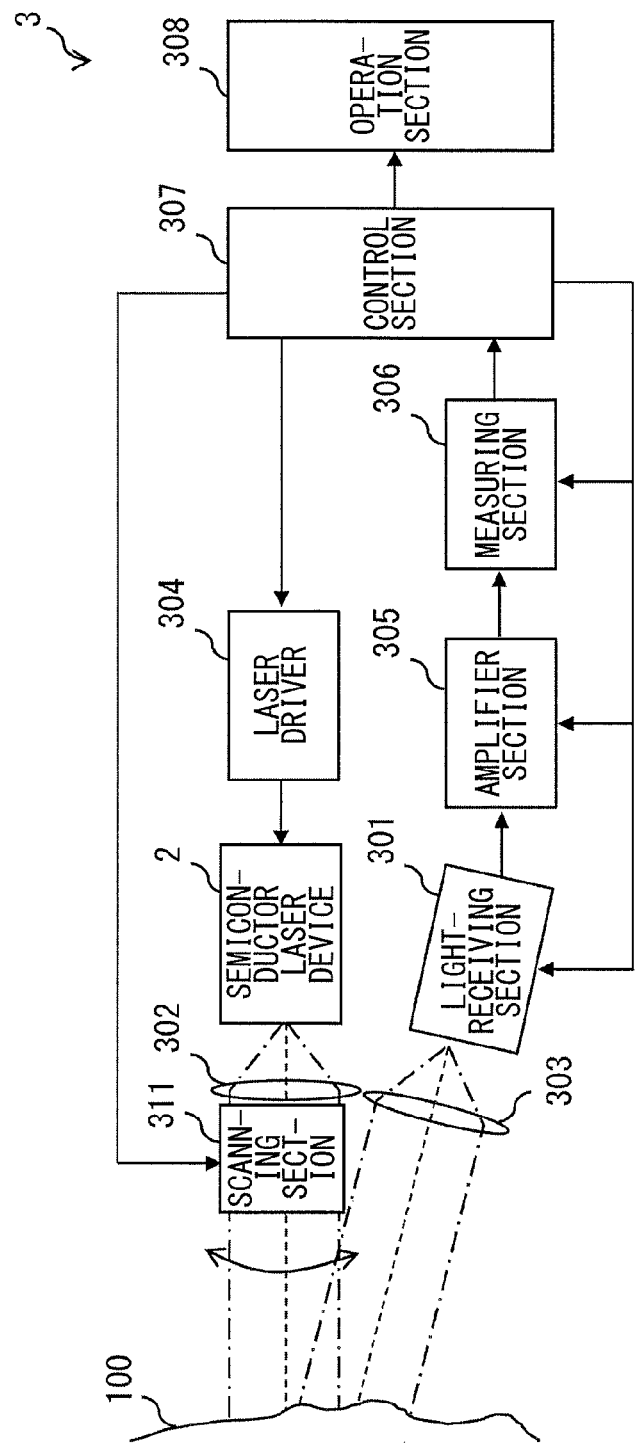
[FIG. 30]

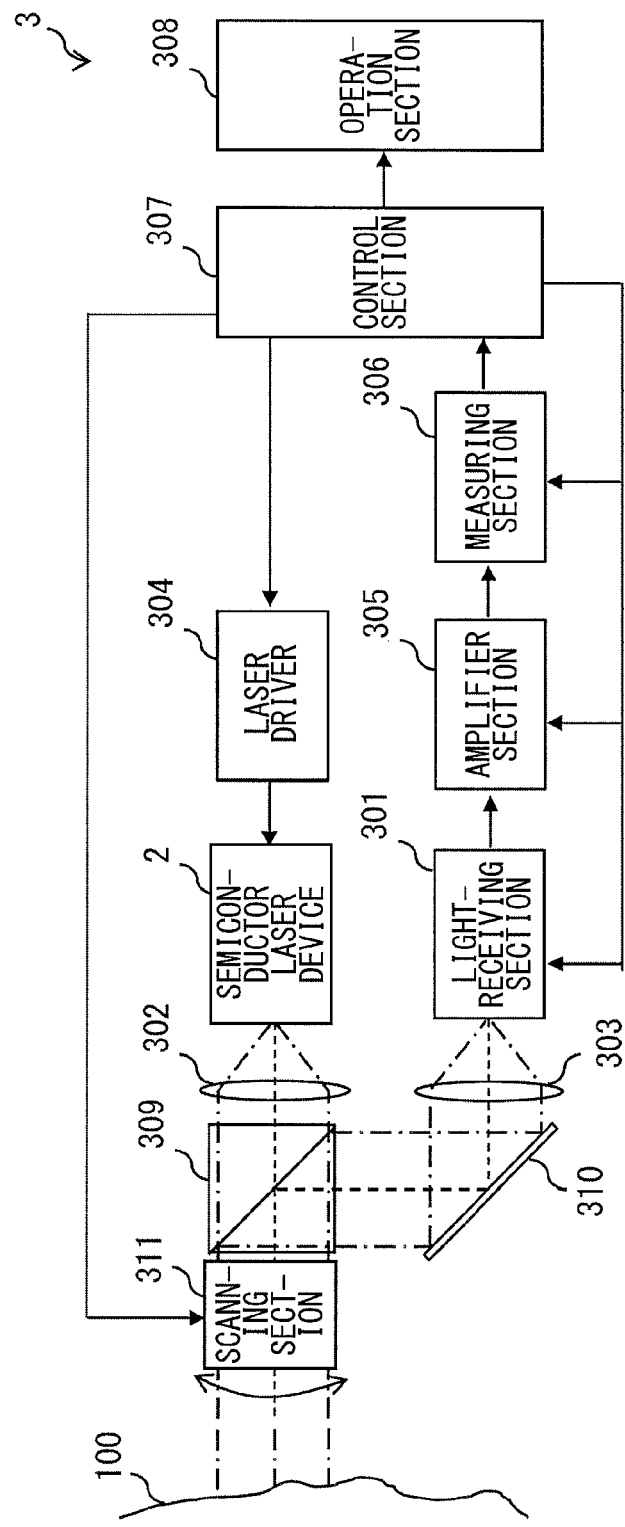
[FIG. 31]

SEMICONDUCTOR LASER, ELECTRONIC APPARATUS, AND METHOD OF DRIVING SEMICONDUCTOR LASER

CROSS REFERENCE TO RELATED APPLICATIONS

This application is a U.S. National Phase of International Patent Application No. PCT/JP2017/023040 filed on Jun. 22, 2017, which claims priority benefit of Japanese Patent Application No. JP 2016-162773 filed in the Japan Patent Office on Aug. 23, 2016. Each of the above-referenced applications is hereby incorporated herein by reference in its entirety.

TECHNICAL FIELD

The present disclosure relates to a semiconductor laser, an electronic apparatus, and a method of driving the semiconductor laser.

BACKGROUND ART

In a semiconductor laser, there is a Q-switch operation as a method of obtaining a high-power pulse by controlling oscillation. In the Q-switch operation, optical loss is initially increased to suppress oscillation, thereby facilitating optical pumping to cause the number of atoms in excited states to sufficiently increase; at that point in time, a Q-value is raised, thus allowing for oscillation. The semiconductor laser that allows for the Q-switch operation is described in the following PTLs 1 to 5, for example.

CITATION LIST

Patent Literature

PTL 1: Japanese Unexamined Patent Application Publication No. H1-262683
PTL 2: Japanese Unexamined Patent Application Publication No. H5-90700
PTL 3: Japanese Unexamined Patent Application Publication No. H10-229252
PTL 4: Japanese Unexamined Patent Application Publication No. 2005-39099
PTL 5: Japanese Unexamined Patent Application Publication No. 2008-258274

SUMMARY OF THE INVENTION

In a semiconductor laser that allows for a Q-switch operation, a current leakage may occur in some cases between a gain region and a Q-switch region. The current leakage that occurs between the gain region and the Q-switch region causes an adverse effect on the Q-switch operation. It is therefore desirable to provide a semiconductor laser, an electronic apparatus, and a method of driving the semiconductor laser that make it possible to suppress a current leakage.

A semiconductor laser according to an embodiment of the present disclosure includes, on a semiconductor substrate, a first semiconductor layer of a first conductivity type, an active layer, and a second semiconductor layer of a second conductivity type, in this order. The semiconductor laser further includes a ridge part formed in the second semiconductor layer and extending in a stacked in-plane direction. The ridge part has a structure in which a plurality of gain regions and a plurality of Q-switch regions are each disposed alternately with each of separation regions being interposed therebetween in an extending direction of the ridge part. The separation regions each have a separation groove that separates from each other, by a space, the gain region and the Q-switch region adjacent to each other. The separation groove has a bottom surface at a position, in the second semiconductor layer, higher than a part corresponding to a foot of each of both sides of the ridge part. The semiconductor laser further includes an electrode provided over the bottom surface of each separation groove with an insulating layer being interposed therebetween.

An electronic apparatus according to an embodiment of the present disclosure includes the semiconductor laser as a light source.

A method of driving a semiconductor laser according to an embodiment of the present disclosure is a method of driving the semiconductor laser including: applying a forward bias pulse voltage to a gain region; applying a reverse bias to a Q-switch region; and applying a forward bias to an electrode.

In the semiconductor laser, the electronic apparatus, the method of driving the semiconductor laser according to the respective embodiments of the present disclosure, the bottom surface of the separation groove in the ridge part is provided at a position, in the second semiconductor layer of the second conductivity type, higher than the part corresponding to the foot of each of both the sides of the ridge part. Further, the electrode is provided over the bottom surface of the separation groove provided in the ridge part with the insulating layer being interposed therebetween. Accordingly, a depletion region formed between the gain region and the Q-switch region causes a part between the gain region and the Q-switch region to have a higher resistance. Moreover, light scattering of carriers in the gain region is suppressed to increase injection carrier density.

According to the semiconductor laser, the electronic apparatus, the method of driving the semiconductor laser of the respective embodiments of the present disclosure, the depletion region formed between the gain region and the Q-switch region causes the part between the gain region and the Q-switch region to have a higher resistance, and the light scattering of carriers in the gain region is suppressed to increase the injection carrier density. Thus, it becomes possible to suppress a current leakage. It is to be noted that the effects of the present disclosure are not necessarily limited to those described here, and may be any of the effects described in the present specification.

BRIEF DESCRIPTION OF DRAWINGS

FIG. 1 illustrates a configuration example of a top surface of a semiconductor laser according to a first embodiment of the present disclosure.
FIG. 2 illustrates a perspective configuration example of the semiconductor laser illustrated in FIG. 1.
FIG. 3 illustrates a perspective configuration example of a portion of the semiconductor laser illustrated in FIG. 2 excluding bank parts.
FIG. 4 illustrates a cross-sectional configuration example of the semiconductor laser illustrated in FIG. 1 taken along a line A-A.
FIG. 5 illustrates a cross-sectional configuration example of the semiconductor laser illustrated in FIG. 1 taken along a line B-B.

FIG. 6 illustrates a cross-sectional configuration example of the semiconductor laser illustrated in FIG. 1 taken along a line C-C.

FIG. 7 illustrates a cross-sectional configuration example of the semiconductor laser illustrated in FIG. 1 taken along a line D-D.

FIG. 8 illustrates a perspective configuration example of a semiconductor laser device mounted with the semiconductor laser illustrated in FIG. 1 on a sub-mount.

FIG. 9 illustrates a cross-sectional configuration example of a wafer in a manufacturing process of the semiconductor laser illustrated in FIG. 1.

FIG. 10 illustrates a cross-sectional configuration example of the wafer in a manufacturing process subsequent to FIG. 9.

FIG. 11 illustrates a cross-sectional configuration example of the wafer in a manufacturing process subsequent to FIG. 10.

FIG. 12A illustrates a cross-sectional configuration example of the wafer in a manufacturing process subsequent to FIG. 11.

FIG. 12B illustrates a cross-sectional configuration example of the wafer in a manufacturing process subsequent to FIG. 11.

FIG. 12C illustrates a cross-sectional configuration example of the wafer in a manufacturing process subsequent to FIG. 11.

FIG. 13 illustrates a cross-sectional configuration example of the wafer in a manufacturing process subsequent to FIG. 12A.

FIG. 14A illustrates an example of a depletion region generated in the semiconductor laser illustrated in FIG. 1.

FIG. 14B illustrates an example of a depletion region generated in the semiconductor laser illustrated in FIG. 1.

FIG. 15 illustrates an example of waveforms of voltages to be applied to the semiconductor laser illustrated in FIG. 1.

FIG. 16 illustrates an example of waveforms of voltages to be applied to the semiconductor laser illustrated in FIG. 1.

FIG. 17 illustrates an example of changes in optical outputs over time.

FIG. 18 illustrates an example of a change in a carrier density of each gain region over time.

FIG. 19 illustrates an example of a change in a carrier density of each gain region over time.

FIG. 20 illustrates an example of a change in a carrier density of each gain region over time.

FIG. 21 illustrates an example of waveforms of voltages to be applied to the semiconductor laser illustrated in FIG. 1.

FIG. 22 illustrates a modification example of the perspective configuration of the semiconductor laser illustrated in FIG. 1.

FIG. 23 illustrates a modification example of the cross-sectional configuration of the semiconductor laser illustrated in FIG. 1 taken along the line B-B.

FIG. 24 illustrates a modification example of the cross-sectional configuration of the semiconductor laser illustrated in FIG. 1 taken along the line A-A.

FIG. 25 illustrates a modification example of the cross-sectional configuration of the semiconductor laser illustrated in FIG. 1 taken along the line A-A.

FIG. 26 illustrates a modification example of the cross-sectional configuration of the semiconductor laser illustrated in FIG. 1 taken along the line B-B.

FIG. 27 illustrates a modification example of the cross-sectional configuration of the semiconductor laser illustrated in FIG. 1 taken along the line A-A.

FIG. 28 illustrates a schematic configuration example of a distance measuring unit according to a second embodiment of the present disclosure.

FIG. 29 illustrates a modification example of the schematic configuration of the distance measuring unit illustrated in FIG. 28.

FIG. 30 illustrates a modification example of the schematic configuration of the distance measuring unit illustrated in FIG. 28.

FIG. 31 illustrates a modification example of the schematic configuration of the distance measuring unit illustrated in FIG. 28.

MODES FOR CARRYING OUT THE INVENTION

In the following, embodiments for carrying out the present disclosure are described in detail with reference to drawings. The following description is directed to specific examples of the present disclosure, and the present disclosure is not limited to the following embodiments. Moreover, the present disclosure is not limited to positions, dimensions, dimension ratios, and other factors of respective components illustrated in the drawings. It is to be noted that the description is given in the following order.

1. First Embodiment (Semiconductor Laser)

An example in which only a gain region is provided with an impurity diffusion region 2. Modification Examples of First Embodiment (Semiconductor Laser)

An example in which there is no protrusion of a separation region in a width-direction
An example in which an impurity diffusion region is formed only in a ridge part
An example in which a Q-switch region is also provided with an impurity diffusion region 3. Second Embodiment (Distance Measuring Unit)

An example in which a semiconductor laser according to any of the foregoing embodiment and modification examples thereof is used as a light source of a distance measuring unit 1. First Embodiment

[Configuration]
Description is given of a configuration of a semiconductor laser 1 according to a first embodiment of the present disclosure. FIG. 1 illustrates a configuration example of a top surface of the semiconductor laser 1 according to the present embodiment. FIG. 2 illustrates a perspective configuration example of the semiconductor laser 1 illustrated in FIG. 1. FIG. 3 illustrates a perspective configuration example of a portion of the semiconductor laser 1 illustrated in FIG. 1 excluding bank parts 20C (described later).

The semiconductor laser 1 is an element that generates an optical pulse, and is used suitably, for example, as a light source of a laser radar, a laser for processing, a medical laser scalpel, and the like. The semiconductor laser 1 is an edge-emitting laser. The semiconductor laser 1 includes a front end surface S1 and a rear end surface S2 that are opposed to each other in a resonator-direction, and a raised ridge part 20A interposed between the front end surface S1 and the rear end surface S2. The semiconductor laser 1 has a length of 1,000 μm, for example, in the resonator-direction. The length of the semiconductor laser 1 in the resonator-direction is appropriately adjustable depending on necessary characteristics. The ridge part 20A extends in the resonator-direction. One end surface of the ridge part 20A is exposed to the front end surface S1, for example, and the other end surface of the ridge part 20A is exposed to the rear end surface S2, for example. It is to be noted that the respective end surfaces of the ridge part 20A may be provided at positions recessed slightly from the front end surface S1 and the rear end surface S2. In this case, it follows that the respective end surfaces of the ridge part 20A are not provided in the same plane as the front end surface S1 and the rear end surface S2. At this occasion, a current non-injection region 20d described later may not be necessarily provided.

The front end surface S1 and the rear end surface S2 are each a surface formed by cleavage. The front end surface S1 and the rear end surface S2 each serve as a resonator mirror, and the ridge part 20A serves as an optical waveguide. The front end surface S1 is provided with an anti-reflection film, for example. The anti-reflection film includes, for example, a dielectric (e.g., $SiO_2$, $TiO_2$, $Ta_2O_5$, SiN, etc.), and is configured to have a reflectance of about 15% at the front end surface S1. The rear end surface S2 is provided with a multilayer reflection film, for example. The multilayer reflection film includes, for example, a dielectric (e.g., $SiO_2$, $TiO_2$, $Ta_2O_5$, SiN, etc.) and Si, and is configured to have a reflectance of about 85% at the rear end surface S2.

The semiconductor laser 1 includes the bank parts 20C in a raised shape at respective sides of the ridge part 20A. In other words, the semiconductor laser 1 has a double-ridge structure configured by the ridge part 20A and the two bank parts 20C. The bank parts 20C are each provided for the purpose of protecting the ridge part 20A and of securing a region for wire-bonding. The bank parts 20C each extend, for example, in a direction parallel to the extending direction of the ridge part 20A. Each of the bank parts 20C may be omitted as necessary. The semiconductor laser 1 is a multi-electrode semiconductor laser provided with a multiplicity of electrodes on the ridge part 20A.

The ridge part 20A is configured by a plurality of gain regions 20a, a plurality of Q-switch regions 20b, and a plurality of separation regions 20c, for example. The plurality of gain regions 20a and the plurality of Q-switch regions 20b are each disposed alternately with the separation region 20c being interposed therebetween in the extending direction of the ridge part 20A. In other words, the ridge part 20A has a structure in which the plurality of gain regions 20a and the plurality of Q-switch regions 20b are each disposed alternately with the separation region 20c being interposed therebetween in the extending direction of the ridge part 20A. Each of the separation regions 20c is disposed between the gain region 20a and the Q-switch region 20b. Each of the separation regions 20c is configured by a separation groove 20B in a recessed shape provided in the ridge part 20A and by a part, of the ridge part 20A, immediately below the separation groove 20B. It is preferable that the gain regions 20a each have a length of 500 μm or less, desirably 300 μm or less. When the gain regions 20a each have a length more than 500 μm, carrier density is less likely to be increased, and thus it becomes highly possible that an optical output may be lowered. Meanwhile, when the gain regions 20a each have a length of 300 μm or less, particularly the carrier density is more likely to be increased, thus making it easier to enhance the optical output.

Either the Q-switch region 20b or the gain region 20a may be provided at an end of the ridge part 20A on side of the front end surface S1. Further, either the Q-switch region 20b or the gain region 20a may be provided at an end of the ridge part 20A on side of the rear end surface S2. Moreover, the current non-injection region 20d may be provided at both the ends of the ridge part 20A. The current non-injection region 20d is a region that suppresses unstable oscillation caused by a current flowing in a vicinity of the front end surface S1 or the rear end surface S2. The current non-injection region 20d is a region where no contact layer 27 described later is provided, and is a region where no current is injected directly from an electrode.

FIG. 4 illustrates a cross-sectional configuration example of the semiconductor laser 1 illustrated in FIG. 1 taken along a line A-A. FIG. 5 illustrates a cross-sectional configuration example of the semiconductor laser 1 illustrated in FIG. 1 taken along a line B-B. FIG. 6 illustrates a cross-sectional configuration example of the semiconductor laser 1 illustrated in FIG. 1 taken along a line C-C. FIG. 7 illustrates a cross-sectional configuration example of the semiconductor laser 1 illustrated in FIG. 1 taken along a line D-D. FIG. 8 illustrates a perspective configuration example of a semiconductor laser device 2 mounted with the semiconductor laser 1 illustrated in FIG. 1 on a sub-mount 201 (described later).

The semiconductor laser 1 includes a substrate 10 and a semiconductor layer 20 formed on the substrate 10. The semiconductor layer 20 includes, for example, a lower cladding layer 21, a lower guide layer 22, an active layer 23, an upper guide layer 24, a first upper cladding layer 25, a second upper cladding layer 26, and a contact layer 27 in this order, from side of the substrate 10. The semiconductor layer 20 may include a layer other than those described above. The semiconductor layer 20 may include a buffer layer at a position between the lower cladding layer 21 and the substrate 10, for example.

The substrate 10 is, for example, a Si-doped n-type GaAs substrate. The lower cladding layer 21 includes, for example, Si-doped n-type $Al_{x1}Ga_{1-x1}As$ (0.2<x1<0.5). The lower guide layer 22 includes, for example, Si-doped n-type $Al_{x2}Ga_{1-x2}As$ (0.1<x1<0.3). The buffer layer includes, for example, Si-doped n-type $Al_{0.3}Ga_{0.7}As$. A concentration of Si included in the substrate 10, the lower cladding layer 21, the lower guide layer 22, and the buffer is about $5×10^{17}$ $cm^{-3}$, for example.

The active layer 23 has a multiple quantum well structure, for example. The multiple quantum well structure is, for example, a structure in which a barrier layer and a well layer are stacked alternately. The barrier layer includes, for example, $Al_{0.3}Ga_{0.9}As$. The well layer includes, for example, $Al_{0.4}Ga_{0.6}As$. In the active layer 23, a dopant and a doping concentration in the multiple quantum well structure that configures the active layer 23 are adjusted to allow an average electric property of the active layer 23 to be of p-type.

The upper guide layer 24 includes, for example, C-doped p-type $Al_{0.3}Ga_{0.7}As$. The first upper cladding layer 25 includes, for example, C-doped p-type $Al_{0.5}Ga_{0.5}As$. The first upper cladding layer 25 includes, for example, etching stop layers 25A and 25B that are disposed apart from each other. The etching stop layers 25A and 25B are each a semiconductor layer having a composition ratio different from a composition ratio of another part of the first upper cladding layer 25. The etching stop layer 25A is disposed closer to the substrate 10 than the etching stop layer 25B to the substrate 10, and includes, for example, C-doped p-type $Al_{0.3}Ga_{0.7}As$. The etching stop layer 25B is disposed more distant from the substrate 10 than the etching stop layer 25A from the substrate 10, and includes, for example, C-doped p-type $Al_{0.3}Ga_{0.7}As$. A layer, of the first upper cladding layer 25, interposed between the etching stop layer 25A and the etching stop layer 25B has a thickness t2 that is a thickness equal to t1±50 nm, for example, provided that t1 denotes a thickness of the contact layer 27. The thickness t2 is a thickness equal to or more than 100 nm, for example.

The second upper cladding layer 26 includes, for example, C-doped p-type $Al_{0.5}Ga_{0.5}As$. The contact layer 27 includes, for example, C-doped p-type GaAs. The active layer 23, the upper guide layer 24, the first upper cladding layer 25, the second upper cladding layer 26, and the contact layer 27 each have a conductivity type that is different from a conductivity type of each of the substrate 10, the buffer layer, the lower cladding layer 21, and the lower guide layer 22. Specifically, the active layer 23, the upper guide layer 24, the first upper cladding layer 25, the second upper cladding layer 26, and the contact layer 27 each have p-conductivity type, whereas the substrate 10, the buffer layer, the lower cladding layer 21, and the lower guide layer 22 each have n-conductivity type. Accordingly, an interface between the lower guide layer 22 and the active layer 23 serves as a p-n junction 20J. That is, the semiconductor layer 20 includes the p-n junction 20J at a position lower than a part corresponding to a foot of each of both sides of the ridge part 20A.

The semiconductor laser 1 includes an impurity diffusion region 25C at a location, of the first upper cladding layer 25, corresponding to the gain region 20a and regions at both sides thereof. The impurity diffusion region 25C is in contact with the second upper cladding layer 26 in the gain region 20a. The impurity diffusion region 25C has the same conductivity type as that of each of the first upper cladding layer 25 and the second upper cladding layer 26. The impurity diffusion region 25C is, for example, a region formed by diffusing Zn to the first upper cladding layer 25. Accordingly, at a location, of the first upper cladding layer 25, corresponding to the gain region 20a, the semiconductor laser 1 has a region (the impurity diffusion region 25C) having a relatively higher p-type impurity concentration than a location (the Q-switch region 20b), of the first upper cladding layer 25, different from the location corresponding to the gain region 20a. A lower end of the impurity diffusion region 25C either may be positioned at an interface between the first upper cladding layer 25 and the upper guide layer 24, or may be positioned in the first upper cladding layer 25, in the upper guide layer 24, or in the active layer 23. The impurity diffusion region 25C has a Zn diffusion concentration of about $1 \times 10^{17}$ $cm^{-3}$ to about $1 \times 10^{19}$ $cm^{-3}$. It is to be noted that the second upper cladding layer 26 preferably has a C concentration that is lower than the Zn diffusion concentration of the impurity diffusion region 25C. In such a case, optical absorption performed by C becomes smaller, thus enhancing the optical output.

The contact layer 27 is exposed to a top surface of the gain region 20a. The etching stop layer 25A is exposed to both sides of the gain region 20a (both sides of a part, of the ridge part 20A, corresponding to the gain region 20a). The gain region 20a has a height corresponding to a thickness from a top surface of the etching stop layer 25A to a top surface of the contact layer 27. Each of both the sides of the gain region 20a (both the sides of the part, of the ridge part 20A, corresponding to the gain region 20a) is dug from the contact layer 27 to a location corresponding to the top surface of the etching stop layer 25A. The gain region 20a is configured by the impurity diffusion region 25C, the second upper cladding layer 26, and the contact layer 27, and serves as a p-type semiconductor region.

The contact layer 27 is exposed to a top surface of the Q-switch region 20b. The etching stop layer 25A is exposed to both sides of the Q-switch region 20b (both sides of a part, of the ridge part 20A, corresponding to the Q-switch region 20b). The Q-switch region 20b has a height corresponding to a thickness from the top surface of the etching stop layer 25A to the top surface of the contact layer 27. Each of both the sides of the Q-switch region 20b (both the sides of the part, of the ridge part 20A, corresponding to the Q-switch region 20b) is dug from the contact layer 27 to the top surface of the etching stop layer 25A. The Q-switch region 20b is configured by the first upper cladding layer 25, the second upper cladding layer 26, and the contact layer 27, and serves as the p-type semiconductor region.

The etching stop layer 25B is exposed to a top surface of the separation region 20c. A part, of the etching stop layer 25B, exposed to the top surface of the separation region 20c is a surface formed by wet etching, for example, and is cleaned with dilute hydrochloric acid, etc., for example. The etching stop layer 25A is exposed to both sides of the separation region 20c (both sides of a part, of the ridge part 20A, corresponding to the separation region 20c). A surface of a part, of the etching stop layer 25A, corresponding to the foot of each of both the sides of the ridge part 20A is a surface formed by wet etching, for example, and is cleaned with dilute hydrochloric acid, etc., for example. The separation region 20c has a height corresponding to a thickness from the top surface of the etching stop layer 25A to the top surface of the etching stop layer 25B. Each of both the sides of the separation region 20c (both the sides of the part, of the ridge part 20A, corresponding to the separation region 20c) is dug from the contact layer 27 to a location corresponding to the top surface of the etching stop layer 25A. The separation groove 20B separates the adjacent gain region 20a and Q-switch region 20b from each other by a space. A bottom surface of the separation groove 20B is provided in the first upper cladding layer 25. Specifically, the bottom surface of the separation groove 20B corresponds to the top surface of the etching stop layer 25B, and is provided at a position higher than the part (the etching stop layer 25A) corresponding to the foot of each of both the sides of the ridge part 20A. The separation region 20c has a width (a width of the ridge part 20A in a width-direction) D3 that is larger than a width D1 of the gain region 20a as well as a width D2 of the Q-switch region 20b. This makes it possible to suppress scattering of guided light caused by the separation groove 20B. A part, of the separation region 20c, corresponding to a bottom of the separation groove 20B is configured by the first upper cladding layer 25 (including the etching stop layers 25A and 25B), and serves as the p-type semiconductor region.

The second upper cladding layer 26 is exposed to a top surface of the current non-injection region 20d. The etching stop layer 25A is exposed to both sides of the current non-injection region 20d (both sides of a part, of the ridge part 20A, corresponding to the current non-injection region 20d). The current non-injection region 20d has a height corresponding to a thickness from the top surface of the etching stop layer 25A to a top surface of the second upper cladding layer 26. Each of both the sides of the current non-injection region 20d (both the sides of the part, of the ridge part 20A, corresponding to the current non-injection region 20d) is dug from the contact layer 27 to a location corresponding to the top surface of the etching stop layer 25A.

The semiconductor laser 1 further includes, on the semiconductor layer 20, for example, an insulating layer 28, a dielectric layer 29, a gain electrode 31, a Q-switch electrode 32, a separation electrode 33, and pad electrodes 34, 35, and 36. The insulating layer 28 is a layer that protects the semiconductor layer 20, and covers an entire top surface of the semiconductor layer 20. The insulating layer 28 is configured, for example, by an insulating inorganic material such as $SiO_2$. The dielectric layer 29 is a layer that reduces capacitance of each of the pad electrodes 33 and 34. The dielectric layer 29 is provided in contact with a part, of a surface of the insulating layer 28, immediately above the bank part 20C, and is configured, for example, by $SiO_2$, polyimide, or the like.

The insulating layer 28 has a plurality of openings on respective parts immediately above the ridge part 20A. The plurality of openings provided in the insulating layer 28 are assigned on a one-to-one basis to respective gain regions 20a and respective Q-switch regions 20b. The gain electrode 31 is formed in the opening formed at a part, of the insulating layer 28, immediately above the gain region 20a. The gain electrode 31 is formed in contact with the top surface of the ridge part 20A (the top surface of the contact layer 27). The gain electrode 31 is an electrode that injects a current into the gain region 20a, and is configured by a metal material. The Q-switch electrode 32 is formed in the opening formed at a part, of the insulating layer 28, immediately above the Q-switch region 20b. The Q-switch electrode 32 is formed in contact with the top surface of the ridge part 20A (the top surface of the contact layer 27). The Q-switch electrode 32 is an electrode that applies a bias voltage to the Q-switch region 20b, and is configured by a metal material. The separation electrode 33 is formed over the bottom surface of the separation groove 20B, with the insulating layer 28 being interposed therebetween. The separation electrode 33 is formed in contact with a surface, of the insulating layer 28, in the separation region 20c. The separation electrode 33 is an electrode for formation of a depletion region 37 (described later) in the separation region 20c, and is configured by a metal material.

The pad electrodes 34, 35, and 36 are each formed on the bank part 20C, and is specifically formed on the dielectric layer 29. The pad electrode 34 is an electrode for bonding of a wire 203, and is electrically coupled to the gain electrode 31. The pad electrode 35 is an electrode for bonding of a wire 204, and is electrically coupled to the Q-switch electrode 32. The pad electrode 36 is an electrode for bonding of a wire 205, and is electrically coupled to the separation electrode 33. The pad electrodes 34, 35, and 36 are each configured by a metal material.

The semiconductor laser 1 further includes, for example, a lower electrode 40 in contact with a back surface of the substrate 10. The lower electrode 40, as well as the gain electrode 31 and the Q-switch electrode 32, is an electrode for driving of the semiconductor laser 1. The lower electrode 40 is configured by a metal material. In a case where the semiconductor laser 1 is mounted on the sub-mount 201, the lower electrode 40 is coupled to a sheet-shaped electrode 202 on the sub-mount 201 via, for example, a solder such as AuSn. The electrode 202 is also an electrode for bonding of the wire 205. The sub-mount 201 is configured by an insulating material having a high heat dissipation property.

[Manufacturing Method]

Next, description is given of a manufacturing method of the semiconductor laser 1 according to the present embodiment. FIG. 9 illustrates a cross-sectional configuration example of a wafer in a manufacturing process of the semiconductor laser 1. FIG. 10 illustrates a cross-sectional configuration example of the wafer in a manufacturing process subsequent to FIG. 9. FIG. 11 illustrates a cross-sectional configuration example of the wafer in a manufacturing process subsequent to FIG. 10. FIGS. 12A, 12B, and 12C each illustrate a cross-sectional configuration example of the wafer in a manufacturing process subsequent to FIG. 11. FIG. 12A illustrates a cross-sectional configuration example of a location corresponding to the line B-B illustrated in FIG. 1. FIG. 12B illustrates a cross-sectional configuration example of a location corresponding to the line C-C illustrated in FIG. 1. FIG. 12C illustrates a cross-sectional configuration example of a location corresponding to the line D-D illustrated in FIG. 1. FIG. 13 illustrates a cross-sectional configuration example of the wafer in a manufacturing process subsequent to FIG. 12A.

In order to manufacture the semiconductor laser 1, for example, a compound semiconductor is formed at once on the substrate 10 including Si-doped n-type GaAs, by means of, for example, an epitaxial crystal growth method such as a metal organic chemical vapor deposition (MOCVD) method. Examples of a material to be used at this occasion for the compound semiconductor include a methyl-based organic metal gas such as trimethylaluminum (TMAl), trimethylgallium (TMGa), trimethylindium (TMIn), and arsine ($AsH_3$)

First, the substrate 10 (wafer) is placed in an MOCVD furnace. Next, the lower cladding layer 21 (e.g., Si-doped n-type $Al_{x1}Ga_{1-x1}As$) and the lower guide layer 22 (e.g., Si-doped n-type $Al_{x2}Ga_{1-x2}As$) are formed in this order on the substrate 10 (see FIG. 9). Subsequently, the active layer 23 (e.g., a multiple quantum well structure in which $Al_{0.1}Ga_{0.9}As$ and $Al_{0.4}Ga_{0.6}As$ are stacked alternately) is formed on the lower guide layer 22 (see FIG. 9). Next, the upper guide layer 24 (e.g., p-type $Al_{0.3}Ga_{0.7}As$) and the first upper cladding layer 25 (e.g., p-type $Al_{0.5}Ga_{0.5}As$) are formed in this order on the active layer 23 (see FIG. 9). At this occasion, in the first upper cladding layer 25, the etching stop layer 25A (e.g., p-type $Al_{0.3}Ga_{0.7}As$) and the etching stop layer 25B (e.g., p-type $Al_{0.3}Ga_{0.7}As$) are formed apart from each other on the upper guide layer 24 (see FIG. 9).

Next, the substrate 10 (wafer) is taken out of the MOCVD furnace. Next, Zn is diffused to a predetermined region of a surface of the first upper cladding layer 25. This allows the impurity diffusion region 25C to be formed (see FIG. 9). At this occasion, Zn is diffused not only to a part to be the ridge part 20A, but also to parts corresponding to both the sides of the ridge part 20A. This makes it possible to easily uniformize a Zn concentration of the part to be the ridge part 20A. A solid phase diffusion method using a ZnO film or a vapor phase diffusion method may be used for diffusion of Zn. For example, the ZnO film is formed in the predetermined region of the surface of the first upper cladding layer 25 to perform solid phase diffusion. Thereafter, the ZnO film is detached to cover the entire surface of the first upper cladding layer 25 with SiN, etc. Thereafter, the substrate 10 (wafer) is annealed, thereby diffusing Zn from a surface layer to a deep part of the first upper cladding layer 25, thus making it possible to decrease the Zn concentration of the surface layer to a desired concentration.

Next, the surface of the first upper cladding layer 25 is cleaned with dilute hydrochloric acid, etc., and thereafter the substrate 10 (wafer) is placed again in the MOCVD furnace. Next, the second upper cladding layer 26 (e.g., C-doped p-type $Al_{0.5}Ga_{0.5}As$) and the contact layer 27 (e.g., C-doped p-type GaAs) are formed in this order on the first upper cladding layer 25. In this manner, the semiconductor layer 20 is formed on the substrate 10 (see FIG. 10).

Next, the substrate 10 (wafer) is taken out of the MOCVD furnace. Next, a CVD method, etc., for example, is used to form a hard mask (a film including $SiO_2$, etc.) in a predetermined pattern on the surface of the semiconductor layer 20 (the contact layer 27). Next, a dry etching method, for example, is used to selectively etch the semiconductor layer 20 via an opening formed in the hard mask, thereby, for example, digging the semiconductor layer 20 to a location immediately before reaching the etching stop layer 25B. Thereafter, for example, a wet etching method employing hydrofluoric acid is used to selectively etch the semiconductor layer 20 via the opening formed in the hard mask, thereby, for example, digging the semiconductor layer 20 to the etching stop layer 25B. In this manner, the separation groove 20B is formed (see FIG. 11). Thereafter, the above-described hard mask is removed.

Next, a CVD method, for example, is used to newly form a hard mask (a film including $SiO_2$, etc.) in a predetermined pattern. Next, a dry etching method, for example, is used to selectively etch the semiconductor layer 20 via an opening formed in the hard mask, thereby digging a location corresponding to each of both the sides of the ridge part 20A to a location immediately before reaching the etching stop layer 25A. Thereafter, for example, a wet etching method employing hydrofluoric acid is used to selectively etch the semiconductor layer 20 via the opening formed in the hard mask, thereby, for example, digging the semiconductor layer 20 to the etching stop layer 25A. In this manner, the ridge part 20A and the two bank parts 20C are formed (see FIGS. 12A, 12B, and 12C). Thereafter, the above-described hard mask is removed.

It is to be noted that only the dry etching may be used to form the separation groove 20B, the ridge part 20A, and the two bank parts 20C, without using the wet etching. In the case of the dry etching, it is possible to highly accurately grasp an etching depth on a real-time basis by monitoring optical interference. For example, upon reaching the etching stop layer 25B or the etching stop layer 25A, optical intensity varies in accordance with the optical interference, thus making it possible to recognize having reached a surface of the etching stop layer 25B or the etching stop layer 25A by capturing the variance in the optical intensity.

Next, for example, the CVD method, etc. is used to form the insulating layer 28 on an entire surface of each of components including the separation groove 20B, the ridge part 20A, and the two bank parts 20C (see FIG. 13). Next, for example, the CVD method, etc. is used to form the dielectric layer 29 on the insulating layer 28, immediately above the bank part 20C. Next, for example, a vapor deposition method, etc. is used to form the gain electrode 31 in the opening, of the insulating layer 28, formed immediately above each of the gain regions 20a, and to form the Q-switch electrode 32 in the opening, of the insulating layer 28, formed immediately above each of the Q-switch regions 20b (see FIG. 13). Further, for example, the vapor deposition method is used to form the separation electrode 33 on the surface of the insulating layer 28, in the separation region 20c, (see FIG. 13). Next, for example, the vapor deposition method, etc. is used to form each of the pad electrodes 34, 35, and 36 on the insulating layer 28 and the dielectric layer 29. At this occasion, in order to prevent a short circuit between the pad electrode 35 and the pad electrode 36, an insulating layer 28A (see FIG. 7) including $SiO_2$, etc. is formed in advance, before formation of the pad electrode 36, on a surface, of the pad electrode 35, where the pad electrode 36 is to be formed. Moreover, as necessary, the pad electrodes 34, 35, and 36 are each made thicker as a film using a plating method, for example. By making each of the pad electrodes 34, 35, and 36 thicker as a film, it becomes possible to prevent each of the pad electrodes 34, 35, and 36 from severing between the ridge part 20A and the bank part 20C.

Next, as necessary, the back surface of the substrate 10 is ground to adjust a thickness of the substrate 10 to a desired thickness. Next, for example, the vapor deposition method, etc. is used to form the lower electrode 40 on the back surface of the substrate 10. Next, the substrate 10 (wafer) is subjected to cleavage to form the front end surface S1 and the rear end surface S2. Lastly, the anti-reflection film is formed on the front end surface S1, and the multilayer reflection film is formed on the rear end surface S2. In this manner, the semiconductor laser 1 is manufactured.

In the semiconductor laser 1 thus manufactured, a drive circuit (e.g., a laser driver 304 described later) outputs, for example, a forward bias (a pulse voltage V1) having an amplitude of several volts and a pulse width of a nanosecond (ns) order (e.g., about 1 ns). Accordingly, for example, a voltage of the gain region 20a (the gain electrode 31) becomes equivalent to the pulse voltage V1, as illustrated in FIGS. 15 and 16. Further, the drive circuit (e.g., the laser driver 304 described later) outputs, for example, a reverse bias (a voltage V2) of negative several volts (voltage V2<0). Accordingly, for example, a voltage of the Q-switch region 20b (the Q-switch electrode 32) becomes equivalent to the voltage V2, as illustrated in FIGS. 15 and 16. Further, the drive circuit (e.g., the laser driver 304 described later) outputs, for example, a forward bias (a voltage V3) of positive several volts (voltage V3>pulse voltage V1). Accordingly, for example, a voltage of the separation region 20c becomes equivalent to the voltage V3, as illustrated in FIGS. 15 and 16.

At this occasion, for example, the voltage V2 either may be a direct current (DC) (fixed value) as illustrated in FIG. 15, or may be a pulse voltage according to application of the pulse voltage V1 as illustrated in FIG. 16. The voltage V2 may be, for example, a pulse voltage that becomes larger in a negative direction during a period including a period from a rising time to a peak time of the pulse voltage V1. The voltage V3 is, for example, a direct current (DC) (fixed value) as illustrated in FIGS. 15 and 16. At this occasion, in the gain region 20a, carriers are gradually accumulated in the active layer 23, as a current flowing into the gain region 20a becomes larger in association with the application of the pulse voltage V1. At a point in time when the carrier density exceeds an oscillation threshold, a photon density increases rapidly to cause laser oscillation to occur. This causes accumulated electron-hole pairs to be rapidly consumed, and, from a point in time when the carrier density falls below an oscillation threshold density, the photon density rapidly decreases to stop the laser oscillation. This allows for obtainment of a laser light pulse of a pulse width (a pulse width of 200 ps or less, for example) shorter than a pulse width of the pulse voltage V1 itself, as indicated by a thick line in FIG. 17.

It is to be noted that a broken line in FIG. 17 indicates an example of a laser light pulse in a case where the Q-switch region 20b is grounded. The laser light pulse indicated by the broken line in FIG. 17 has a pulse width of about sub-ns. In a case where the Q-switch region 20b is grounded, there is less voltage drop caused by a photovoltaic current generated in the Q-switch region 20b; the Q-switch region 20b operates as a absorbent having less voltage fluctuation, thus allowing for obtainment of an optical pulse closer to a waveform of the pulse voltage V1.

It has been known, for a behavior of the carrier density of the active layer in the Q-switch operation, that a modeling is possible using traveling-wave rate equation (TRE) (Reference Literature: Ultrafast diode lasers, Peter Vasilev, Atech House Publishers). FIGS. 18, 19, and 20 each illustrate an example of results of verification of a model in accordance with the semiconductor laser 1 performed uniquely by the present inventors with reference to a TRE method. FIG. 18 illustrates a transient response after provision of two gain regions 20a at a resonator length of 1,000 μm and input of a step current of 4 A. FIG. 19 illustrates a transient response after provision of five gain regions 20a at a resonator length of 1,000 μm and input of a step current of 4 A. FIG. 20 illustrates a transient response after provision of nine gain regions 20a at a resonator length of 1,000 μm and input of a step current of 4 A. In all of FIGS. 18, 19, and 20, a reverse bias is applied to the Q-switch region 20b.

The carrier density of the gain region 20a gradually increases to reach a peak value ($1.2 \times 10^{25}$ cm$^{-3}$) at about 0.6 ns. Meanwhile, at an end of the gain region 20a, the carrier density is saturated at a degree slightly larger than a transparent carrier density. One reason for this is that light in each of the gain regions 20a promotes stimulated emission. In FIG. 19, a region where the carrier density is reduced due to the stimulated emission is decreased. It is appreciated, in FIG. 20, that an average carrier density is increased. In this manner, in a Q-switch semiconductor laser in which high current injection is performed into the gain region 20a, it is preferable that the gain regions 20a each have a length of 500 μm or less, desirably 300 μm or less. However, due to increase in the number of division of the resonator length, the number of the separation region is increased, thus lowering combined resistance of a part between the gain region 20a and the Q-switch region 20b. The number of the division is preferably adjusted to allow the combined resistance to be 100 kohms or more.

A carrier lifetime of the gain region 20a depends on the square of the carrier density. Accordingly, the carrier lifetime of the gain region 20a is saturated at the time of the high current injection. A typical semiconductor laser performs laser oscillation at a carrier density sufficiently lower than a saturation carrier density. When a reverse bias is adjusted to allow a loss of the Q-switch region 20b to be barely lower than a maximum gain in the saturation carrier density of the gain region 20a, the laser oscillation occurs. In a case, for example, where the reverse bias is applied through high resistance in accordance with FIG. 15, voltage drop occurs due to a photocurrent of the Q-switch region 20b, and thus the reverse bias becomes small to cause a Q-value of the semiconductor laser 1 to increase sharply. This allows for obtainment of pulse light having a high peak value. When a current leakage from the gain region 20a to the Q-switch region 20b becomes larger, voltage drop occurs at a high resistance. Accordingly, there are several undesirable influences such as difficulty in application of the reverse bias to the Q-switch region 20b, a lowered peak value of the pulse light due to smaller fluctuation of the Q-value, or increase in the pulse width. As such a passive Q-switch method, the structure of the semiconductor laser 1 according to the present embodiment is applicable.

Meanwhile, as illustrated in FIGS. 18, 19, and 20, the carrier density of the gain region 20a reaches a peak value about 0.6 ns behind. In accordance with FIG. 16, the reverse voltage is applied to the Q-switch region 20b before application of a pulse current of the gain region 20a, and the loss of the Q-switch region 20b is actively lowered after the saturation of the carrier density of the gain region 20a; at this occasion, a gain exceeds the loss, thus causing the laser oscillation to occur. The photocurrent of the Q-switch region 20b undergoes voltage drop similarly to the passive Q-switch method. Accordingly, an increasing speed of the Q-value is enhanced, thus allowing for obtainment of the pulse light having a high peak value. A saturation time of the carrier density is within about 3 ns, because it depends on a structure, etc. of the active layer 23. Accordingly, it is not desirable that a width of the pulse current for the gain region 20a be 5 ns or more, because of increase in a reactive current.

[Effects]

Next, description is given of effects of the semiconductor laser 1 according to the present embodiment.

There has been remarkable progress in recent 3D shape measurement techniques, and such 3D shape measurement techniques have been actively utilized in fields such as a gesture input in game devices and various electronics products as well as preventive safety and automatic driving of automobiles. Laser radar using a time-of-flight (TOF) method is a direct method that allows for measurement of time until pulse light having been applied to an object is scattered and returned as well as measurement of a distance to the object; the laser radar has been widely used. The laser radar has limitations on a range of use, depending on performance of devices that configure a system. The higher a pulse energy of a laser light source becomes, the longer a distance to be measured becomes, allowing distance accuracy to be enhanced. There are many industrial advantages of the semiconductor laser that is able to directly generate pulse light, as follows: it is possible to provide the semiconductor laser in a smaller size and less expensively; and it is possible to achieve a high electricity-light conversion efficiency and lower power consumption. B. Lanz et al. obtains a pulse width of 80 ps and a pulse energy of 3 nJ using a wide-stripe semiconductor laser having a saturable absorption property (Brigitte Lanz, Boris S. Ryvkin, Eugene A. Avrutin, and Juha T. Kostamovaara, "Performance improvement by a saturable absorber in gain-switched asymmetric-waveguide laser diodes." Opt. Express 29781, Vol. 21, 2013).

In order to increase a pulse energy using a semiconductor laser, it is necessary to increase the number of carriers to be injected into a gain region. Accordingly, several method are employed as follows: increasing a thickness of the active layer; increasing a width of a stripe; and applying the reverse bias to a saturable absorption region to increase variation in the Q-value. The method of varying the Q-value in the resonator in this manner is referred to as a Q-switch semiconductor laser. A passive Q-switch semiconductor laser passively induces variation in the Q-value. An active Q-switch pulse semiconductor laser is able to modulate the reverse bias to be applied to the Q-switch region to further increase the variation in the Q-value. In order to further increase the pulse energy, it is necessary to increase the variation in the Q-value and to further increase a voltage to be applied to the gain region. In particular, in a case where a watt-class pulse peak value is obtained using a narrow stripe structure having a stripe width of several μm or less, a potential difference between the Q-switch region and the gain region becomes larger to reach 10 V or higher.

However, a typical Q-switch pulse semiconductor laser including AlGaAs, etc. has a small resistance between the Q-switch region and the gain region. Accordingly, when the potential difference between the Q-switch region and the gain region becomes larger, a leakage current between the Q-switch region and the gain region is increased. Such a leakage current inhibits the Q-switch operation due to various factors. For example, the passive Q-switch pulse semiconductor laser has a smaller variation in the Q-value when the leakage current becomes larger than a photocurrent of the Q-switch region. It is necessary for the active Q-switch pulse semiconductor laser to increase an allowable current of a switching element, thus lowering a switching speed.

It is conceivable to form a groove in the separation region as a method of increasing a resistance between the Q-switch region and the gain region. The formation of the groove in the separation region causes increase in guide loss, increase in stimulated emission in the gain region due to light reflection in the separation region, and lowering of a pulse energy due to laser oscillation. As a method of increasing a resistance between two electrodes while maintaining optical coupling between the two electrodes, it has been proposed to provide, in a region distant from a light emission region, a separation groove that reaches a substrate, and to remove, in a vicinity of the light emission region, only a n-type GaAs electrode layer in a surface layer (Japanese Unexamined Patent Application Publication No. H1-262683). In such a case, however, a p-type AlGaAs cladding layer exists under the n-type GaAs electrode layer, thus causing a current leakage to occur via the p-type AlGaAs cladding layer. As another method of increasing a resistance between two electrodes, there has been proposed a method of performing ion injection between the two electrodes (Japanese Unexamined Patent Application Publication No. 2008-258274). In such a case, however, there is a possibility that increase in defect due to the ion injection may cause increase in the guide loss to lower long-term reliability. Further, in a case where a conductivity type is inversed by the ion injection, a current path is generated in an inversion region due to the defect, etc., thus making it difficult to ignore the influence due to the current leakage.

In contrast, in the semiconductor laser 1 according to the present embodiment, the reverse bias voltage is applied to the Q-switch region 20b. Further, when the reverse bias voltage of the separation region 20c is small and is not sufficient, for example, the depletion region 37 is formed at a part, of the active layer 23, corresponding to a lower part of the Q-switch region 20b and at a boundary part, of the first upper cladding layer 25, between the Q-switch region 20b and the separation region 20c, as illustrated in FIG. 14A. However, when the reverse bias voltage of the separation region 20c becomes larger, for example, the depletion region 37 is formed at a part, of the active layer 23, corresponding to a lower part of the Q-switch region 20b and at a boundary part, of each of the active layer 23, the upper guide layer 24, and the first upper cladding layer 25, between the Q-switch region 20b and the separation region 20c, as illustrated in FIG. 14B. In this example, the active layer 23 has a thickness of 200 nm, the upper guide layer 24 has a thickness of 100 nm, and the first upper cladding layer 25 has a thickness of 350 nm. In addition, the active layer 23, the upper guide layer 24, and the first upper cladding layer 25 have an average carrier density of $1\times10^{17}$ cm$^{-3}$. In such a case, when the reverse bias voltage of −10 V is applied to the Q-switch region 20b, an upper end of the depletion region 37 is located at 375 nm from the p-n junction 20J. Moreover, the active layer 23 has a thickness of 200 nm, the upper guide layer 24 has a thickness of 100 nm, and the first upper cladding layer 25 has a thickness of 350 nm. In addition, the active layer 23, the upper guide layer 24, and the first upper cladding layer 25 have an average carrier density of $5\times10^{16}$ cm$^{-3}$. In such a case, when the reverse bias voltage of −10 V is applied to the Q-switch region 20b, the upper end of the depletion region 37 is located at 550 nm from the p-n junction 20J. In both cases, the upper end of the depletion region 37 is located above the active layer 23. Accordingly, holes generated by optical absorption are immediately discharged from an electric field applied to the active layer 23, and an amount of optical absorption is increased. Further, the depletion region 37 expands up to the separation region 20c, and thus a part between the gain region 20a and the Q-switch region 20b (i.e., the separation region 20c) has a higher resistance of 100 kohms or more. As a result, it becomes possible to cause a current leakage from the gain region 20a to the Q-switch region 20b to be 1 mA or less, and thus to make the current leakage small enough to be almost ignored. Moreover, light scattering of carriers in the gain region 20a is suppressed to increase injection carrier density, thus making it possible to allow for higher power of the semiconductor laser 1.

2. Modification Examples of First Embodiment

Next, description is given of a modification example of the semiconductor laser 1 according to the foregoing embodiment.

Modification Example A

In the foregoing embodiment, for example, the voltage V3 outputted from the drive circuit (e.g., the laser driver 304 described later) may include a pulse voltage waveform according to the application of the pulse voltage V1, as illustrated in FIG. 21. The voltage V3 may include, for example, a pulse voltage waveform that has a peak in a negative direction after the pulse voltage V1 is applied to the gain region 20a (e.g., at a time when the peak of the pulse voltage V1 is passed). In the voltage V3, the above-described pulse voltage waveform may include a pulse voltage waveform that has a peak in the negative direction in a period of time when the pulse voltage V1 is applied to the gain region 20a and when the peak of the pulse voltage V1 is passed. That is, the voltage V3 may include a pulse voltage waveform that falls and rises in the period of time when the pulse voltage V1 is applied to the gain region 20a.

At this occasion, the drive circuit (e.g., the laser driver 304 described later) outputs, for example, the reverse bias (the voltage V2) of negative several volts (voltage V2<0), as indicated by alternate long and short dash lines in FIG. 21. However, the pulse voltage waveform having a peak in the negative direction of the voltage V3 causes a pulse voltage fluctuation having a peak in a positive direction to occur in a voltage V2' of the Q-switch region 20b (the Q-switch electrode 32). The voltage V2' may include, for example, a pulse voltage waveform that has a peak in the positive direction after the pulse voltage V1 is applied to the gain region 20a (e.g., at the time when the peak of the pulse voltage V1 is passed). That is, the voltage V3 has an active waveform outputted from the drive circuit (e.g., the laser driver 304 described later), and the voltage V2 has a passive waveform generated due to the voltage fluctuation caused by the voltage V3.

In such a case, the depletion region 37 makes transition from a state illustrated in FIG. 14B to a state illustrated in FIG. 14A; that is, a leakage current is generated between the gain region 20a and the Q-switch region 20b. The leakage current causes voltage drop due to resistance of the Q-switch region 20b; when loss of the Q-switch region 20b is actively lowered, a gain exceeds the loss, thus causing the laser oscillation to occur. The photocurrent of the Q-switch region 20b undergoes voltage drop similarly to the passive Q-switch method. Accordingly, an increasing speed of the Q-value is enhanced, thus allowing for obtainment of the pulse light having a high peak value.

Modification Example B

In the foregoing embodiment and the modification example thereof, for example, the width (the width of the ridge part 20A in the width-direction) D3 of the separation region 20c may be equal to the width D1 of the gain region 20a and to the width D2 of the Q-switch region 20b, as illustrated in FIG. 22. In such a case as well, an optical loss in the separation groove 20B is very small, and thus it becomes possible to allow for higher power of the semiconductor laser 1.

Modification Example C

In the foregoing embodiment and the modification examples thereof, for example, the impurity diffusion region 25C may be provided only in the ridge part 20A, as illustrated in FIG. 23. In such a case as well, it is possible to homogenize impurity density in the impurity diffusion region 25C.

Modification Example D

In the foregoing embodiment and the modification examples thereof, for example, a region similar to the impurity diffusion region 25C (an impurity diffusion region 25D) may be provided also in the Q-switch region 20b, as illustrated in FIG. 24. In this case, the p-n junction 20J is formed at a position lower than the part corresponding to the foot of each of both the sides of the ridge part 20A, similarly to the foregoing embodiment and the modification examples thereof. Accordingly, the depletion region 37 expands up to the separation region 20c, and thus the part between the gain region 20a and the Q-switch region 20b (i.e., the separation region 20c) has a higher resistance of 100 kohms or more. As a result, it becomes possible to cause a current leakage from the gain region 20a to the Q-switch region 20b to be 1 mA or less, and thus to make the current leakage small enough to be almost ignored.

Modification Example E

In the foregoing embodiment and the modification examples thereof, for example, the etching stop layers 25A and 25B may be omitted, as illustrated in FIGS. 25, 26, and 27.

2. Second Embodiment

Next, description is given of a distance measuring unit 3 according to a second embodiment of the present disclosure. FIG. 28 illustrates a schematic configuration example of the distance measuring unit 3. The distance measuring unit 3 measures a distance to a test object 100 by means of a time-of-flight (TOF) method. The distance measuring unit 3 includes the semiconductor laser device 2 as a light source. The distance measuring unit 3 includes, for example, the semiconductor laser device 2, a light-receiving section 301, lenses 302 and 302, the laser driver 304, an amplifier section 305, a measuring section 306, a control section 307, and an operation section 308.

The light-receiving section 301 detects light reflected by the test object 100. The light-receiving section 301 is configured by a photodetector, for example. The light-receiving section 301 may be configured by an avalanche photo diode (APD), a single-photon avalanche diode (SPAD), a multi-pixel single-photon avalanche diode (MP-SPAD), or the like. The lens 302 is a lens that collimates light emitted from the semiconductor laser device 2; the lens 302 is a collimating lens. The lens 303 is a lens that condenses light reflected by the test object 100 and guides the condensed light to the light-receiving section 301; the lens 303 is a condensing lens.

The laser driver 304 is, for example, a driver circuit that drives the semiconductor laser device 2 (the semiconductor laser 1). The amplifier section 305 is, for example, an amplifier circuit that amplifies a detection signal outputted from the light-receiving section 301. The measuring section 306 is, for example, a circuit that generates a signal corresponding to a difference between a single inputted from the amplifier section 305 and a reference signal. The measuring section 306 is configured by a Time to Digital Converter (TDC), for example. The reference signal may be either a signal inputted from the control section 307 or an output signal of a detection section that directly detects an output of the semiconductor laser device 2. The control section 307 is, for example, a processor that controls the light-receiving section 301, the laser driver 304, the amplifier section 305, and the measuring section 306. The operation section 308 is a circuit that derives distance information on the basis of the signal generated by the measuring section 306.

The distance measuring unit 3 may include, for example, a polarization beam splitter (PBS) 309 between the lens 302 and the test object 100 as well as a reflection mirror 310 that causes light reflected by the PBS 309 to enter the light-receiving section 301, as illustrated in FIG. 29. In such a case, light emitted from the semiconductor laser device 2 and light reflected by the test object 100 pass through the same optical path between the PBS 309 and the test object 100, thus making it possible to enhance measuring accuracy.

The distance measuring unit 3 may include, between the lens 302 and the test object 100, a scanning section 311 that scans the light emitted from the semiconductor laser device 2, for example, as illustrated in FIG. 30. For example, the scanning section 311 performs measurement of distance information of the test object 100 on a single axis, i.e., two-dimensional measurement. The distance measuring unit 3 illustrated in FIG. 29 performs distance measurement of only one location of the test object 100, i.e., one-dimensional measurement of only a range direction. In contrast, the distance measuring unit 3 illustrated in FIG. 30 includes the scanning section 311, thus making it possible to perform the two-dimensional measurement.

For example, the scanning section 311 may perform measurement of distance information of the test object 100 on two axes, i.e., three-dimensional measurement. In such a case, it is possible for the distance measuring unit 3 illustrated in FIG. 30 to perform the three-dimensional measurement.

The distance measuring unit 3 may include, for example, the PBS 309, the reflection mirror 310, and the scanning section 311, as illustrated in FIG. 31. In such a case, it is possible not only to enhance measuring accuracy but also to perform the two-dimensional measurement or the three-dimensional measurement.

In the present embodiment, the semiconductor laser device 2 is used as a light source in the distance measuring unit 3. This makes it possible to emit high-power laser light and thus to enhance detection accuracy.

In the present embodiment, the semiconductor laser device 2 is used as a light source in the distance measuring unit 3. This makes it possible to emit high-power laser light and thus to enhance detection accuracy.

Although the present disclosure has been described hereinabove with reference to a plurality of embodiments and modification examples thereof, the present disclosure is not limited to the foregoing respective embodiments, and may be modified in a variety of ways. It is to be noted that the effects described herein are merely examples. The effects of the present disclosure are not limited to those described herein. The present disclosure may have effects other than those described herein.

Moreover, for example, the present disclosure may have the following configurations.

(1)
A semiconductor laser including, on a semiconductor substrate:
a first semiconductor layer of a first conductivity type;
an active layer;
a second semiconductor layer of a second conductivity type, in order;
a ridge part formed in the second semiconductor layer and extending in a stacked in-plane direction; and
an electrode,
the ridge part having a structure in which a plurality of gain regions and a plurality of Q-switch regions are each disposed alternately with each of separation regions being interposed therebetween in an extending direction of the ridge part,
the separation regions each having a separation groove that separates from each other, by a space, the gain region and the Q-switch region adjacent to each other,
the separation groove having a bottom surface at a position, in the second semiconductor layer, higher than a part corresponding to a foot of each of both sides of the ridge part,
the electrode being provided over the bottom surface with an insulating layer being interposed therebetween.

(2)
The semiconductor laser according to (1), in which the second semiconductor layer includes a first different-composition-ratio semiconductor layer having a composition ratio different from a composition ratio of another part of the second semiconductor layer, and
the bottom surface is a portion of a top surface of the first different-composition-ratio semiconductor layer.

(3)
The semiconductor laser according to (2), in which the second semiconductor layer includes a second different-composition-ratio semiconductor layer having a composition ratio different from the composition ratio of the other part of the second semiconductor layer, and
a top surface of the part corresponding to the foot of each of both the sides of the ridge part is a portion of a top surface of the second different-composition-ratio semiconductor layer.

(4)
The semiconductor laser according to any one of (1) to (3), in which each of the bottom surface and the top surface of the part corresponding to the foot of each of both the sides of the ridge part is a surface formed by wet etching.

(5)
The semiconductor laser according to any one of (1) to (4), in which the semiconductor laser includes a p-n junction at a position lower than the part corresponding to the foot of each of both the sides of the ridge part.

(6)
The semiconductor laser according to any one of (1) to (5), in which the second semiconductor layer includes, at a part corresponding to each of the gain regions, an impurity diffusion region of the second conductivity type having an impurity concentration relatively higher than an impurity concentration of a part corresponding to each of the Q-switch regions.

(7)
An electronic apparatus including a semiconductor laser as a light source,
the semiconductor laser including, on a semiconductor substrate,
a first semiconductor layer of a first conductivity type,
an active layer,
a second semiconductor layer of a second conductivity type, in order,
a ridge part formed in the second semiconductor layer and extending in a stacked in-plane direction, and
an electrode,
the ridge part having a structure in which a plurality of gain regions and a plurality of Q-switch regions are each disposed alternately with each of separation regions being interposed therebetween in an extending direction of the ridge part,
the separation regions each having a separation groove that separates from each other, by a space, the gain region and the Q-switch region adjacent to each other,
the separation groove having a bottom surface at a position, in the second semiconductor layer, higher than a part corresponding to a foot of each of both sides of the ridge part,
the electrode being provided over the bottom surface with an insulating layer being interposed therebetween.

(8)
The electronic apparatus according to (7), further including a drive section that drives the semiconductor laser,
the drive section applying a forward bias pulse voltage to the gain region,
the drive section applying a reverse bias to the Q-switch region, and
the drive section applying a forward bias to the electrode.

(9)
The electronic apparatus according to (7), in which a forward bias to be applied to the electrode has a pulse voltage waveform having a peak in a negative direction in a period of time when the pulse voltage is applied to the gain region and when a peak of a waveform of the pulse voltage to be applied to the gain region is passed.

(10)
A method of driving a semiconductor laser,
the semiconductor laser including, on a semiconductor substrate,
a first semiconductor layer of a first conductivity type,
an active layer,
a second semiconductor layer of a second conductivity type, in order, a ridge part formed in the second semiconductor layer and extending in a stacked in-plane direction, and an electrode, the ridge part having a structure in which a plurality of gain regions and a plurality of Q-switch regions are each disposed alternately with each of separation regions being interposed therebetween in an extending direction of the ridge part, the separation regions each having a separation groove that separates from each other, by a space, the gain region and the Q-switch region adjacent to each other, the separation groove having a bottom surface at a position, in the second semiconductor layer, higher than a part corresponding to a foot of each of both sides of the ridge part, the electrode being provided over the bottom surface with an insulating layer being interposed therebetween, the method including:

applying a forward bias pulse voltage to the gain region;

applying a reverse bias to the Q-switch region; and applying a forward bias to the electrode.

(11)

The method of driving the semiconductor laser according to (10), in which the pulse voltage has a pulse width of a nano-second order.

(12)

The method of driving the semiconductor laser according to (11), in which the forward bias includes a direct current.

This application claims the benefit of Japanese Priority Patent Application JP2016-162773 filed with the Japan Patent Office on Aug. 23, 2016, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A semiconductor laser, comprising:
on a semiconductor substrate:
a first semiconductor layer of a first conductivity type;
an active layer;
a second semiconductor layer of a second conductivity type, in order;
a ridge part formed in the second semiconductor layer and extending in a stacked in-plane direction; and
an electrode, wherein
the ridge part has a structure in which a plurality of gain regions and a plurality of Q-switch regions are each disposed alternately with each of separation regions interposed therebetween in an extending direction of the ridge part,
each of the separation regions has a separation groove that separates, by a space, a gain region of the plurality of gain regions and a Q-switch region of the plurality of Q-switch regions,
the gain region is adjacent to the Q-switch region,
the separation groove has a bottom surface at a position, in the second semiconductor layer, higher than a part corresponding to a foot of each of both sides of the ridge part, and
the electrode is being provided over the bottom surface with an insulating layer interposed therebetween.

2. The semiconductor laser according to claim 1, wherein the second semiconductor layer includes a first different-composition-ratio semiconductor layer having a composition ratio different from a composition ratio of another part of the second semiconductor layer, and
the bottom surface is a portion of a top surface of the first different-composition-ratio semiconductor layer.

3. The semiconductor laser according to claim 2, wherein the second semiconductor layer includes a second different-composition-ratio semiconductor layer having a composition ratio different from the composition ratio of the other part of the second semiconductor layer, and
a top surface of the part corresponding to the foot of each of both the sides of the ridge part is a portion of a top surface of the second different-composition-ratio semiconductor layer.

4. The semiconductor laser according to claim 3, wherein each of the bottom surface and the top surface of the part corresponding to the foot of each of both the sides of the ridge part is a surface formed by wet etching.

5. The semiconductor laser according to claim 1, wherein the semiconductor laser comprises a p-n junction at a position lower than the part corresponding to the foot of each of both the sides of the ridge part.

6. The semiconductor laser according to claim 1, wherein the second semiconductor layer includes, at a part corresponding to each of the plurality of gain regions, an impurity diffusion region of the second conductivity type having an impurity concentration relatively higher than an impurity concentration of a part corresponding to each of the plurality of Q-switch regions.

7. An electronic apparatus, comprising:
a semiconductor laser as a light source, wherein the semiconductor laser includes, on a semiconductor substrate:
a first semiconductor layer of a first conductivity type;
an active layer;
a second semiconductor layer of a second conductivity type, in order;
a ridge part formed in the second semiconductor layer and extending in a stacked in-plane direction; and
an electrode, wherein
the ridge part has a structure in which a plurality of gain regions and a plurality of Q-switch regions are each disposed alternately with each of separation regions interposed therebetween in an extending direction of the ridge part,
each of the separation regions has a separation groove that separates, by a space, a gain region of the plurality of gain regions and a Q-switch region of the plurality of Q-switch regions,
the gain region is adjacent to the Q-switch region,
the separation groove has a bottom surface at a position, in the second semiconductor layer, higher than a part corresponding to a foot of each of both sides of the ridge part,
the electrode is provided over the bottom surface with an insulating layer interposed therebetween.

8. The electronic apparatus according to claim 7, further comprising a drive section configured to drive the semiconductor laser, wherein
the drive section is configured to apply applying a forward bias pulse voltage to the gain region,
the drive section is configured to apply applying a reverse bias to the Q-switch region, and
the drive section is configured to apply applying a forward bias to the electrode.

9. The electronic apparatus according to claim 7, wherein a forward bias to be applied to the electrode has a pulse voltage waveform having a peak in a negative direction in a period of time when a pulse voltage is applied to the gain region and when a peak of a waveform of the pulse voltage to be applied to the gain region is passed.

10. A method of driving a semiconductor laser, the method comprising:
in the semiconductor laser including, on a semiconductor substrate:
a first semiconductor layer of a first conductivity type;
an active layer;
a second semiconductor layer of a second conductivity type, in order;
a ridge part formed in the second semiconductor layer and extending in a stacked in-plane direction; and
an electrode, wherein
the ridge part has a structure in which a plurality of gain regions and a plurality of Q-switch regions are each disposed alternately with each of separation regions interposed therebetween in an extending direction of the ridge part,
each of the separation regions has a separation groove that separates, by a space, a gain region of the plurality of gain regions and a Q-switch region of the plurality of Q-switch regions,
the gain region is adjacent to the Q-switch region,
the separation groove has a bottom surface at a position, in the second semiconductor layer, higher than a part corresponding to a foot of each of both sides of the ridge part,
the electrode is provided over the bottom surface with an insulating layer interposed therebetween:
applying a forward bias pulse voltage to the gain region;
applying a reverse bias to the Q-switch region; and
applying a forward bias to the electrode.

11. The method of driving the semiconductor laser according to claim 10, wherein the forward bias pulse voltage has a pulse width of a nano-second order.

12. The method of driving the semiconductor laser according to claim 11, wherein the forward bias comprises a direct current.

* * * * *